(12) United States Patent
Khalili Amiri et al.

(10) Patent No.: US 9,324,403 B2
(45) Date of Patent: Apr. 26, 2016

(54) VOLTAGE-CONTROLLED MAGNETIC ANISOTROPY (VCMA) SWITCH AND MAGNETO-ELECTRIC MEMORY (MERAM)

(71) Applicant: THE REGENTS OF THE UNIVERSITY OF CALIFORNIA, Oakland, CA (US)

(72) Inventors: Pedram Khalili Amiri, Los Angeles, CA (US); Kang L. Wang, Santa Monica, CA (US); Kosmas Galatsis, Torrance, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/813,421

(22) Filed: Jul. 30, 2015

(65) Prior Publication Data

US 2015/0332749 A1    Nov. 19, 2015

Related U.S. Application Data

(60) Division of application No. 14/082,118, filed on Nov. 16, 2013, now Pat. No. 9,129,691, which is a continuation of application No. PCT/US2012/038693, filed on May 18, 2012.

(Continued)

(51) Int. Cl.
 *G11C 11/00* (2006.01)
 *G11C 11/16* (2006.01)
(Continued)

(52) U.S. Cl.
 CPC .......... *G11C 11/161* (2013.01); *G11C 11/1673* (2013.01); *G11C 11/1675* (2013.01); *H01L 43/02* (2013.01); *H01L 43/08* (2013.01); *H01F 10/3254* (2013.01)

(58) Field of Classification Search
 CPC .......... G11C 11/1673; G11C 11/1675; H01L 43/02; H01L 10/3254
 USPC ................................. 365/158, 145, 171, 173
 See application file for complete search history.

(56) References Cited

U.S. PATENT DOCUMENTS

| 6,579,635 B2 * | 6/2003 | Krusin-Elbaum ..... B82Y 25/00 148/121 |
| 6,730,949 B2 | 5/2004 | Kishi et al. |

(Continued)

FOREIGN PATENT DOCUMENTS

| WO | 2010-126854 A1 | 11/2010 |
| WO | 2012/159078 A3 | 11/2012 |

OTHER PUBLICATIONS

Korean Intellectual Property Office, International Search Report and Written Opinion issued on Jan. 24, 2013 for corresponding International Patent Application No. PCT/UC2012/038693, published as WO 2012/159078 (pp. 1-8) with claims (pp. 9-16) pp. 1-16.

(Continued)

*Primary Examiner* — Viet Q Nguyen
(74) *Attorney, Agent, or Firm* — O'Banion & Ritchey LLP; John P. O'Banion

(57) ABSTRACT

Voltage controlled magnetic tunnel junctions and memory devices are described which provide efficient high speed switching of non-volatile magnetic devices at high cell densities. Implementations are described which provide a wide range of voltage control alternatives with in-plane and perpendicular magnetization, bidirectionally switched magnetization, and control of domain wall dynamics.

4 Claims, 25 Drawing Sheets

Related U.S. Application Data

(60) Provisional application No. 61/488,096, filed on May 19, 2011, provisional application No. 61/488,099, filed on May 19, 2011, provisional application No. 61/546,894, filed on Oct. 13, 2011.

(51) Int. Cl.
    H01L 43/08 (2006.01)
    H01L 43/02 (2006.01)
    H01F 10/32 (2006.01)

(56) References Cited

U.S. PATENT DOCUMENTS

| | | | | |
|---|---|---|---|---|
| 7,078,897 | B2 * | 7/2006 | Yablonskiy | G01R 33/56341 324/306 |
| 8,841,739 | B2 * | 9/2014 | Khalili Amiri | H01L 43/08 257/421 |
| 8,988,923 | B2 * | 3/2015 | Khalili Amiri | G11C 11/161 365/145 |
| 9,036,407 | B2 * | 5/2015 | Wang | G11C 11/161 365/158 |
| 9,047,950 | B2 * | 6/2015 | Amiri | G11C 15/02 |
| 9,099,641 | B2 * | 8/2015 | Khalili Amiri | H01L 43/08 |
| 9,129,691 | B2 * | 9/2015 | Khalili Amiri | G11C 11/161 |
| 2004/0212933 | A1 | 10/2004 | Kim et al. | |
| 2005/0078418 | A1 | 4/2005 | Saito et al. | |
| 2011/0031569 | A1 | 2/2011 | Watts et al. | |
| 2014/0071728 | A1 | 3/2014 | Khalili Amiri et al. | |
| 2014/0071732 | A1 | 3/2014 | Khalili Amiri et al. | |
| 2014/0124882 | A1 | 5/2014 | Khalili Amiri et al. | |
| 2014/0169085 | A1 | 6/2014 | Wang et al. | |

OTHER PUBLICATIONS

S. Yakata et al., "Influence of perpendicular magnetic anisotropy on spin-transfer switching current in Co Fe B Mg O Co Fe B magnetic tunnel junctions," J. Appl. Phys. 105, 07D131 (Apr. 2, 2009).

S. Ikeda et al., "A perpendicular-anisotropy CoFeB—MgO magnetic tunnel junction," Nature Materials 9, 721 (Jul. 11, 2010).

P. Khalili Amiri et al., "Switching current reduction using perpendicular anisotropy in CoFeB—MgO magnetic tunnel junctions," Appl. Phys. Lett. 98, 112507 (Mar. 17, 2011).

T. Maruyama et al., "Large voltage-induced magnetic anisotropy change in a few atomic layers of iron Nature," Nanotech. 4, 158 (Jan. 18, 2009).

M. Endo et al., "Electric-field effects on thickness dependent magnetic anisotropy of sputtered MgO/Co40Fe40B20/Ta structures," Appl. Phys. Lett. 96, 212503 (May 27, 2010).

Shiota et al., Induction of coherent magnetization switching in a few atomic layers of FeCo using voltage pulses Nature Materials 11, 39-43 (Nov. 13, 2011).

Wang et al., "Electric-field-assisted switching in magnetic tunnel junctions" Nature Materials 11, 64-68 (Nov. 13, 2011).

* cited by examiner

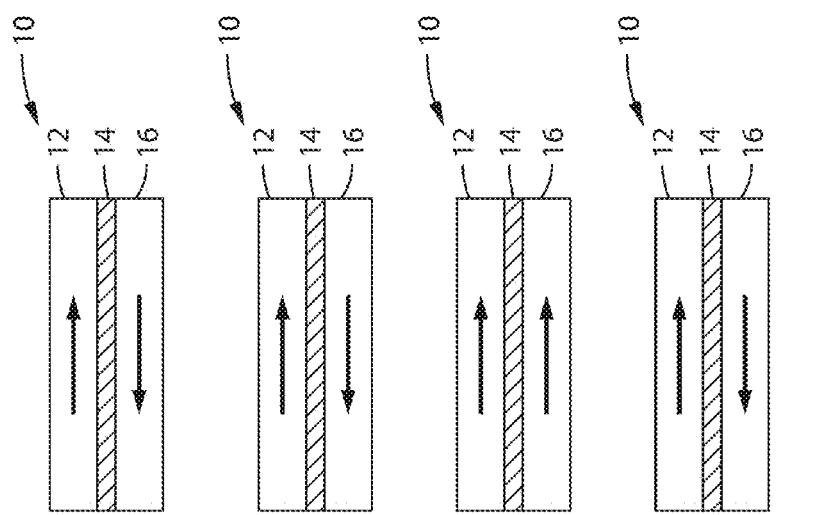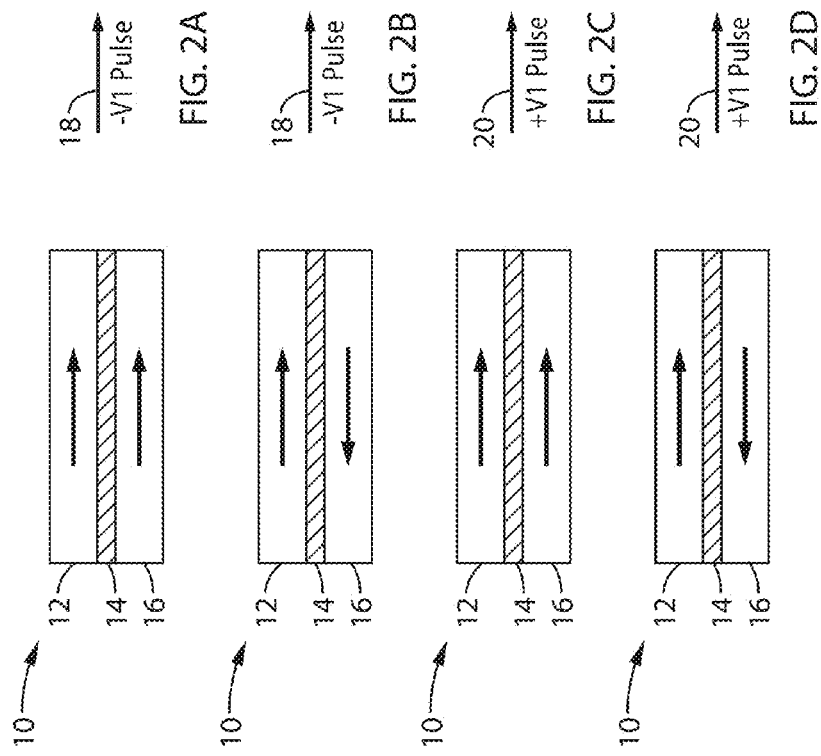

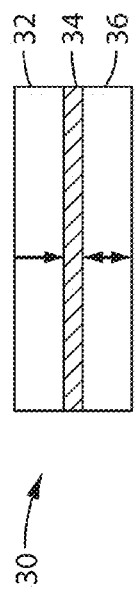
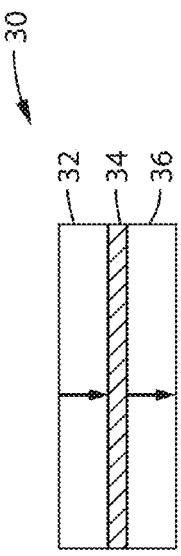
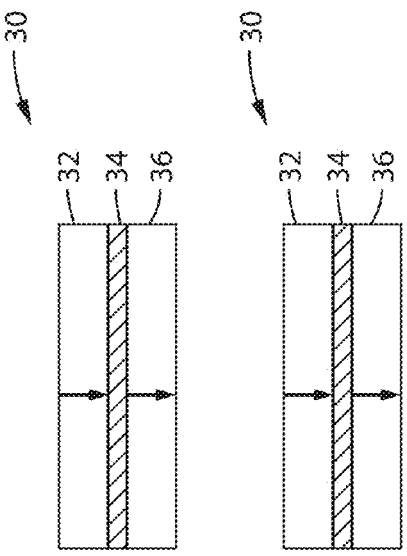
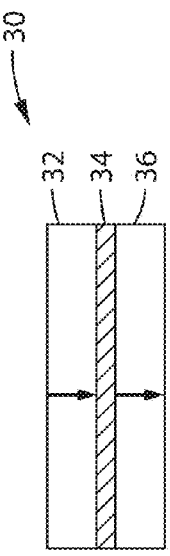
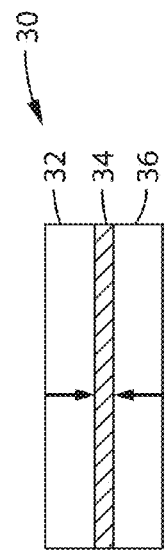

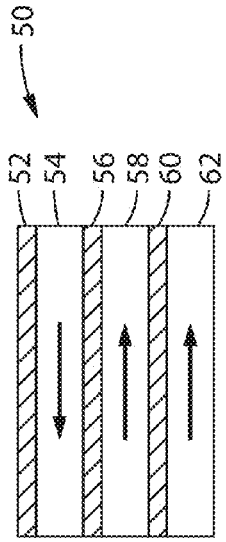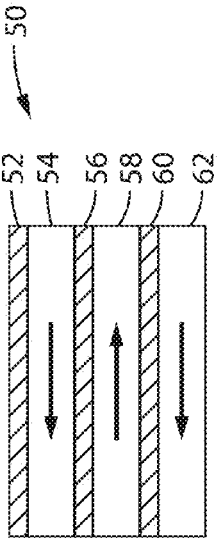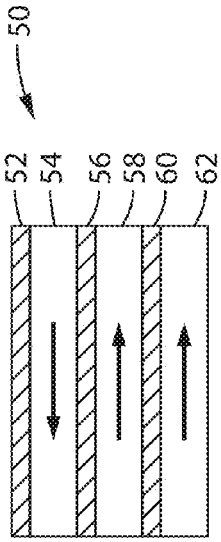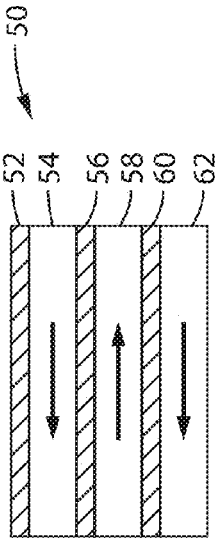
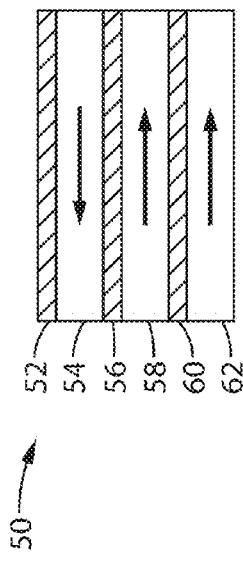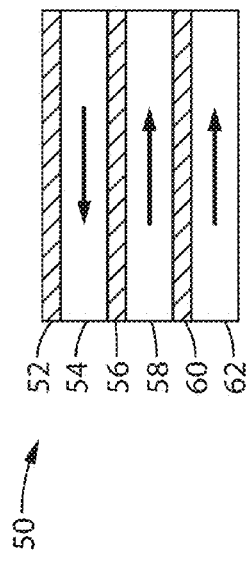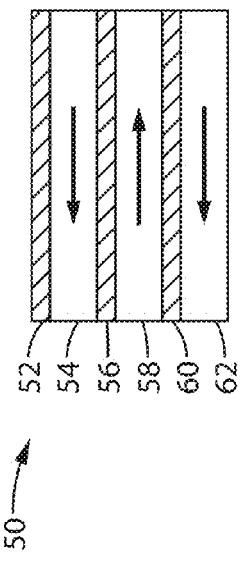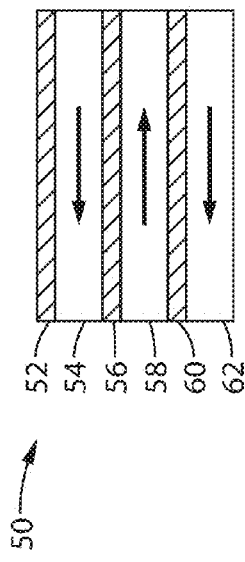

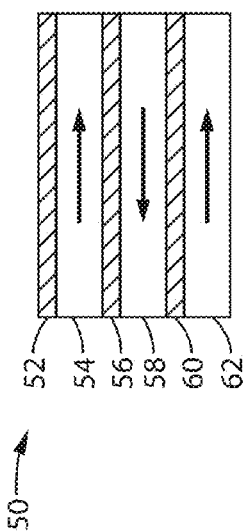
-V1 Pulse
FIG. 7A
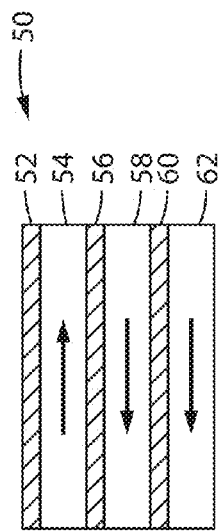
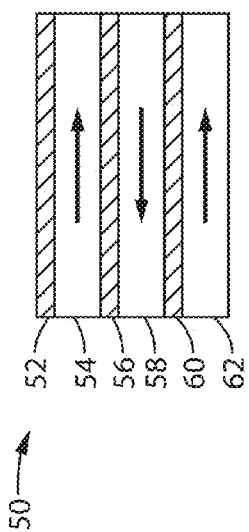
-V2 Pulse
FIG. 7B
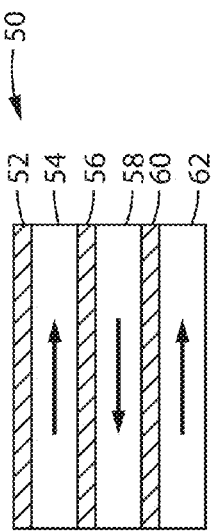
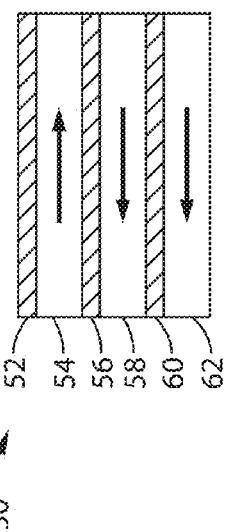
-V1 Pulse
FIG. 7C
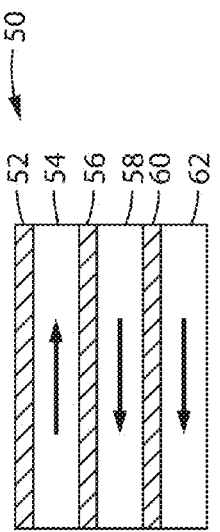
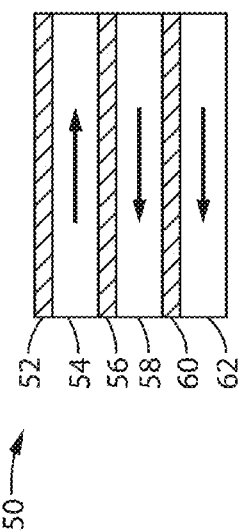
-V2 Pulse
FIG. 7D
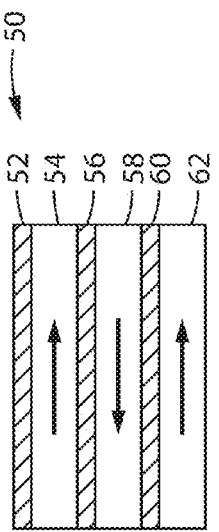

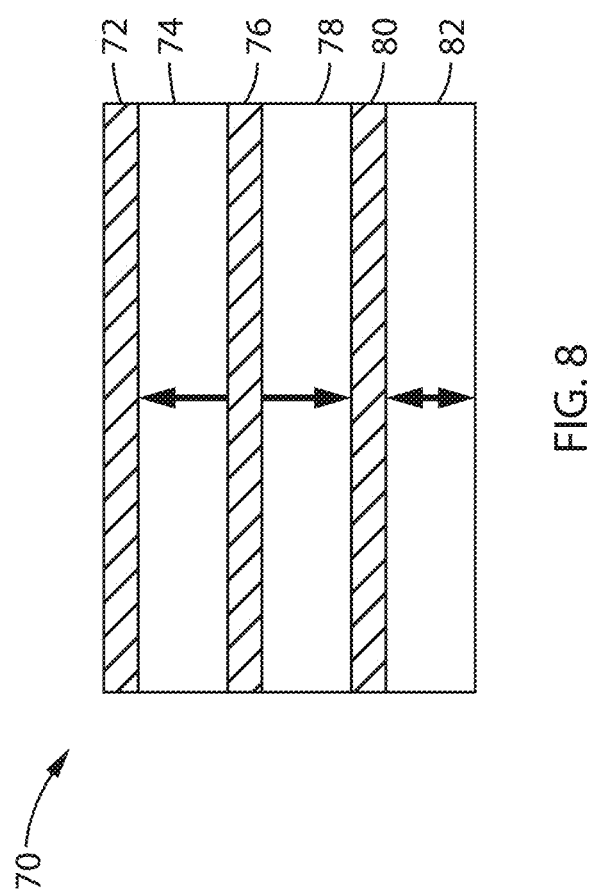

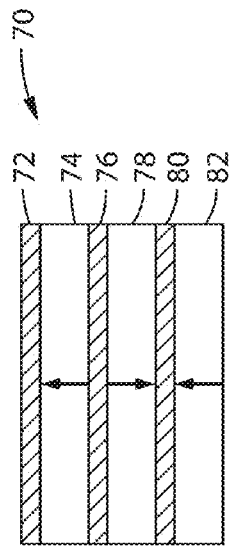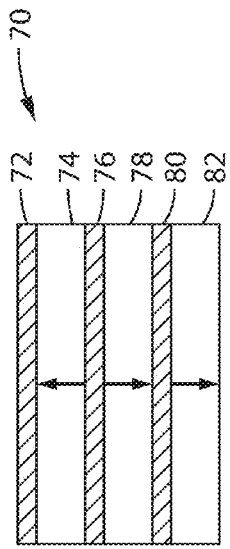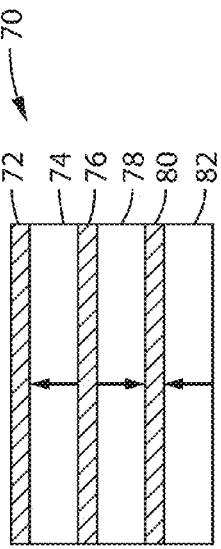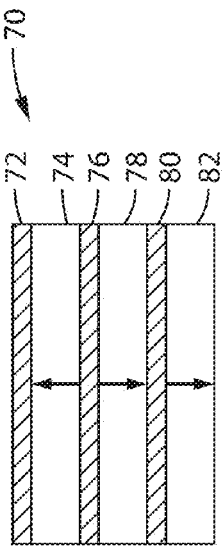
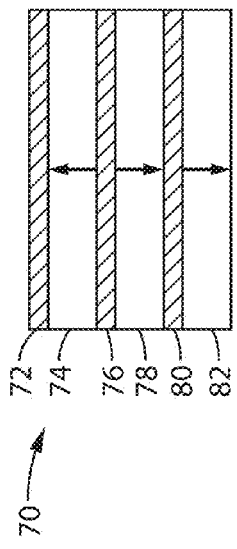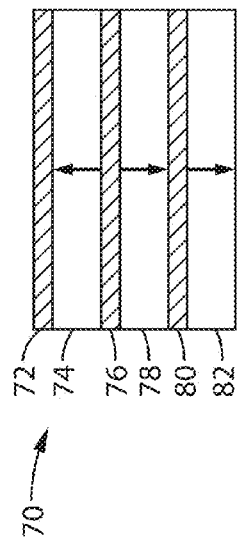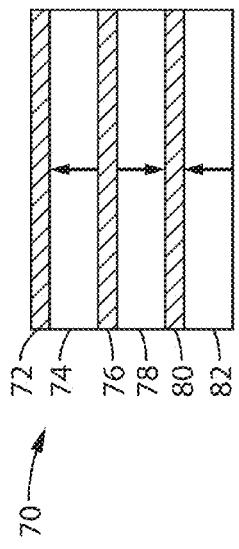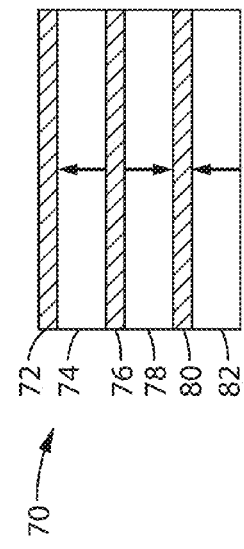
FIG. 9A  FIG. 9B  FIG. 9C  FIG. 9D

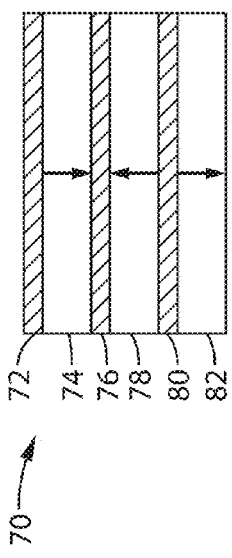
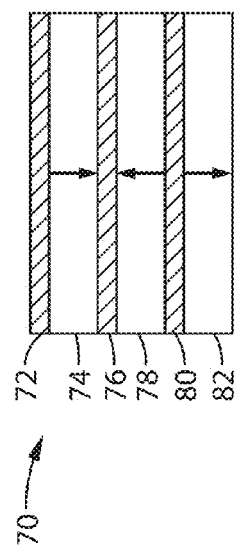
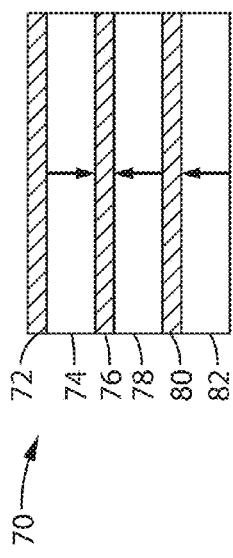
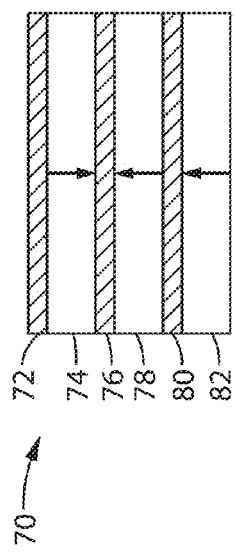
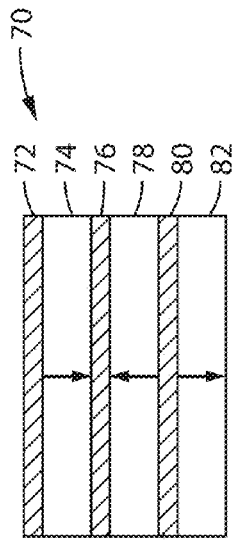
FIG. 10A
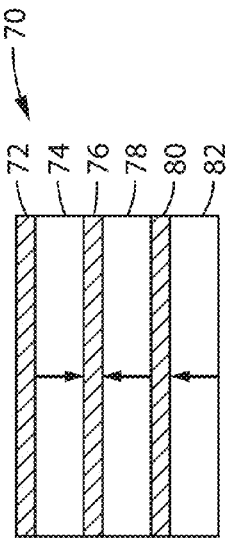
FIG. 10B
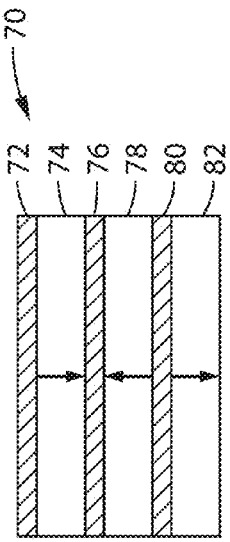
FIG. 10C
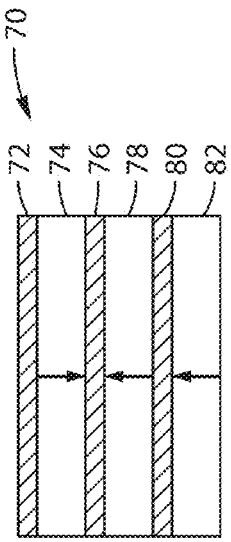
FIG. 10D

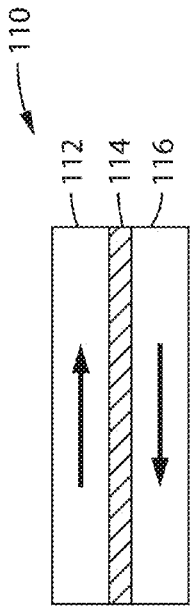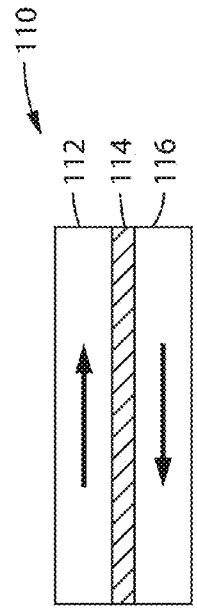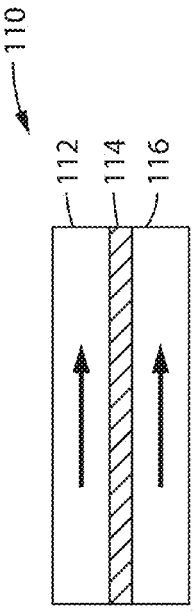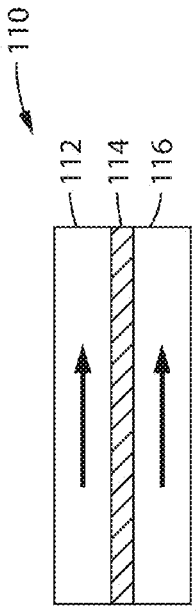
FIG. 13A
FIG. 13B
FIG. 13C
FIG. 13D
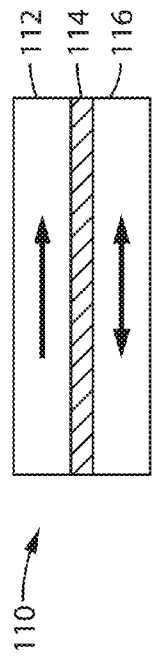
FIG. 12
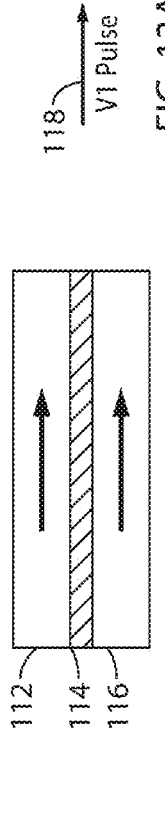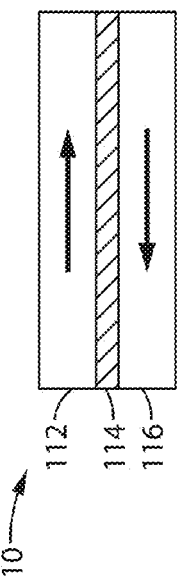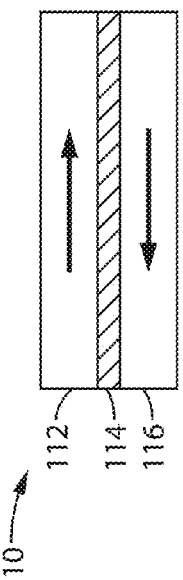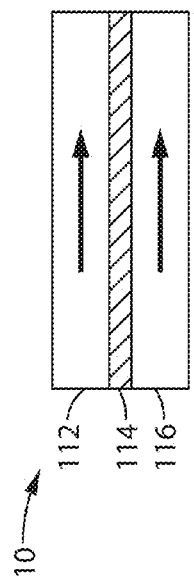

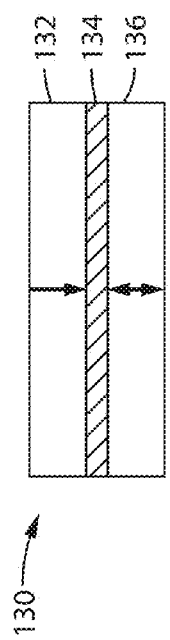
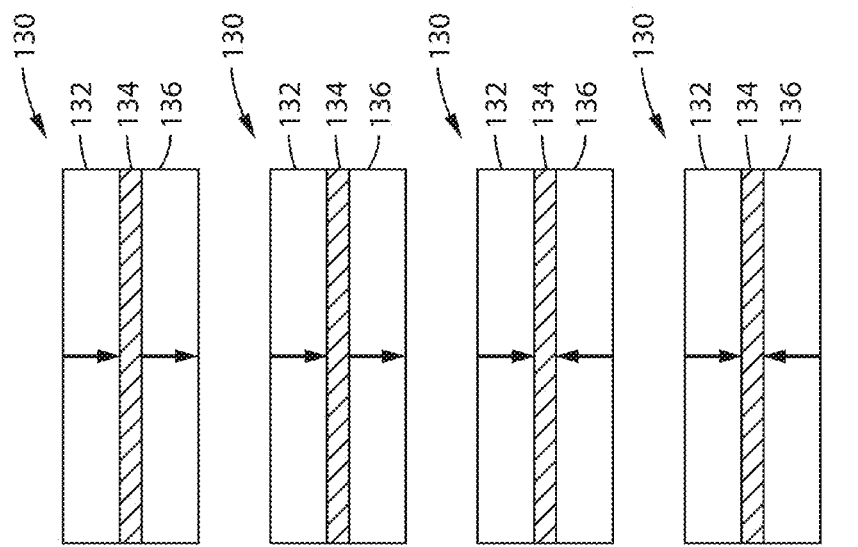
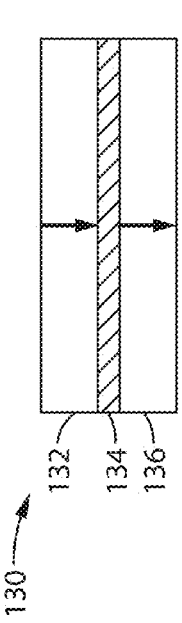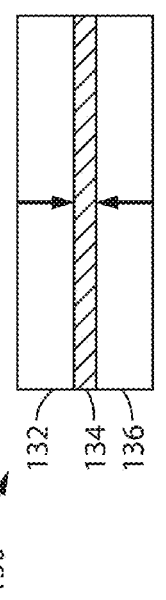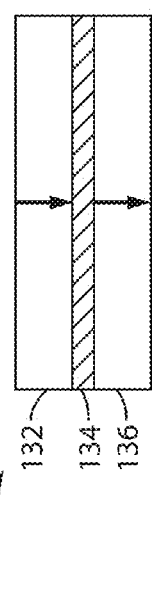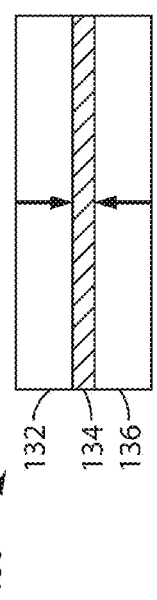

VOLTAGE-CONTROLLED MAGNETIC ANISOTROPY (VCMA) SWITCH AND MAGNETO-ELECTRIC MEMORY (MERAM)

CROSS-REFERENCE TO RELATED APPLICATIONS

This application is a division of U.S. patent application Ser. No. 14/082,118 filed on Nov. 16, 2013, incorporated herein by reference in its entirety, which is a 35 U.S.C. §111(a) continuation of PCT international application number PCT/US2012/038693 filed on May 18, 2012, incorporated herein by reference in its entirety, which claims priority to and the benefit of U.S. provisional patent application Ser. No. 61/488,096 filed on May 19, 2011, incorporated herein by reference in its entirety, and which claims priority to and the benefit of U.S. provisional patent application Ser. No. 61/488,099 filed on May 19, 2011, incorporated herein by reference in its entirety, and which claims priority to and the benefit of U.S. provisional patent application Ser. No. 61/546,894 filed on Oct. 13, 2011, incorporated herein by reference in its entirety.

The above-referenced PCT international application was published as PCT International Publication No. WO 2012/159078 on Nov. 22, 2012 and republished on Mar. 28, 2013, which publications are incorporated herein by reference in their entireties.

STATEMENT REGARDING FEDERALLY SPONSORED RESEARCH OR DEVELOPMENT

This invention was made with Government support under HR0011-10-C-0153, awarded by the U.S. Department of Defense, Defense Advanced Research Projects Agency. The Government has certain rights in the invention.

INCORPORATION-BY-REFERENCE OF MATERIAL SUBMITTED IN A COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to voltage induced magnetic switching, and more particularly to magnetic switches and memory devices which are voltage controlled.

2. Description of Related Art

Modern electronic devices increasingly incorporate significant amounts of solid state memory. The electronics industry continually seeks for higher density devices that provide low power consumption. Magnetic memory devices by their nature provide non-volatile characteristics, and are drawing increasing attention as a next generation memory type.

However, in proposed magnetic memory devices, such as field-switched (toggle) MRAM, spin transfer torque MRAM (STT-MRAM) or thermally-assisted switching MRAM (TAS-M RAM) significant current flow is required for switching states. Each of these proposed MRAM devices are switched in response to substantial current flow, such as through the layers of the MTJ, through an adjacent conductor, or by heating of the MTJ using an electric current. These devices thus offer only limited scalability, in view of the need to control and distribute large electric currents for switching the devices.

Accordingly, a need exists for high density and highly energy efficient magnetic memory devices. The present invention fulfills this need and overcomes shortcomings of previous magnetic memory devices.

BRIEF SUMMARY OF THE INVENTION

A voltage-controlled magnetic anisotropy (VCMA) switch (or magneto-electric junction (MEJ)) and magneto-electric RAM (MeRAM or ME-MRAM) memory are taught in the present invention which can utilize in-plane or perpendicular magnetization. Control of domain wall dynamics in a nano-magnet are also described utilizing voltage control according to the invention.

A voltage-controlled magnetic anisotropy (VCMA) switch is taught in which the switch state is controlled by applying a voltage to change magnetization. The device relies on magnetic anisotropy, and electric-field dependence of magnetic anisotropy for performing the switching. It will be appreciated that anisotropy is the property of being directionally dependent, as opposed to isotropy, which implies identical properties in all directions. Anisotropy can be defined as a difference, when measured along different axes, in a material's physical or mechanical properties, in this case magnetization properties. The materials and geometries (e.g., layer shape and thicknesses) for the VCMA switch are selected so that in-plane (IP) and out-of-plane (OOP) anisotropic properties in the free layer of the switch are nearly equal, wherein modification of the OOP anisotropy and rotation of the magnetization in the free layer are induced in response to application of a voltage, and switching is completed in response to the presence of a stray magnetic field.

A nonvolatile magnetic memory cell (MeRAM) is taught in which information is written by switching the state of a magnetic bit, comprising a VCMA switch, using an electric field (voltage), instead of magnetic fields or electrical currents. The innovative cells can be utilized within a voltage-controlled magnetoelectric random access memory. Beneficially, MeRAM according to the invention can be manufactured as a backend process to CMOS fabrication. MeRAM cells can provide significantly higher cell densities, better scalability, and 1 to 3 orders of magnitude lower energy per switch than other types of magnetic memory devices, largely because switching is performed in response to voltage, instead of current or a magnetic field. In addition to use as memory, cells or devices according to the invention can be utilized in conjunction with CMOS logic circuits to realize nonvolatile logic circuits.

The VCMA switches and MeRAM devices perform switching without relying on the flow of electric charge currents either through the device or through a conductor placed close to the device, as they rely on the VCMA effect for switching.

Embodiments of the invention, have a DE barrier layer between the FM free layer and FM fixed layers which block current passage (e.g., DE layer >1 nm). In at least one embodiment of the invention, the DE layer is slightly thinner to allow a small amount of leakage current for reading device state and determining switching direction, but this is not sufficiently conductive to allow changing the state of the VCMA switch, or writing the state of a MeRAM bit. Prior systems relied on current switching, wherein large currents are made to pass through the device or a proximal conductor for switching. In at least one embodiment the fixed layer is divided into a multilayer structure comprising a fixed layer and a semi-fixed layer, separated by a spacer, to further enhance the VCMA effect and provide for bidirectional switching.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 1 is a schematic of an in-plane VCMA switch according to an embodiment of the present invention.

FIG. 2A through FIG. 2D are schematics of switching the in-plane VCMA switch of FIG. 1, according to an embodiment of the present invention.

FIG. 3 is a schematic of a perpendicular VCMA switch according to an embodiment of the present invention.

FIG. 4A through FIG. 4D are schematics of switching the perpendicular VCMA switch of FIG. 3, according to an embodiment of the present invention.

FIG. 6A through FIG. 6D are schematics of switching a first embodiment of the in-plane MeRAM of FIG. 5, according to an embodiment of the present invention.

FIG. 7A through FIG. 7D are schematics of switching a second embodiment of the in-plane MeRAM of FIG. 5, according to an embodiment of the present invention.

FIG. 8 is a schematic of a perpendicular MeRAM according to an embodiment of the present invention.

FIG. 9A through FIG. 9D are schematics of switching a first embodiment of the perpendicular MeRAM of FIG. 8, according to an embodiment of the present invention.

FIG. 10A through FIG. 10D are schematics of switching a second embodiment of the perpendicular MeRAM of FIG. 8, according to an embodiment of the present invention.

FIG. 12 is a schematic of a in-plane MeRAM utilizing field like spin torque to establish switching direction according to an embodiment of the present invention.

FIG. 13A through FIG. 13D are schematics of switching the MeRAM of FIG. 12, according to an embodiment of the present invention.

FIG. 14 is a schematic of a perpendicular MeRAM utilizing field like spin torque to establish switching direction according to an embodiment of the present invention.

FIG. 15A through FIG. 15D are schematics of switching the perpendicular MeRAM of FIG. 14, according to an embodiment of the present invention.

DETAILED DESCRIPTION OF THE INVENTION

Figure 5:
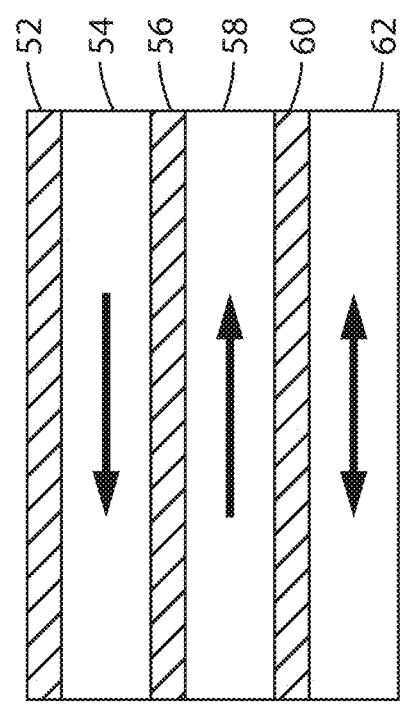
FIG. 5 is a schematic of a in-plane MeRAM memory bit according to an embodiment of the present invention.

A voltage controlled magnetic tunnel junction switch is described along with magnetic memory embodiments. Out of plane (OOP) anisotropy at an interface between ferro-magnetic (FM) material and a dielectric (DE) material (at an FM/DE interface) has been recently reported, and characterized with regard to conditions, including voltage. The present invention utilizes the novel properties of OOP anisotropy in designing a magnetic switch operating on these effects.

In the present invention, information is stored in the state of a magnetic bit (i.e., in a free layer, FL). The magnetization of the FL can be switched from one state to another using an applied voltage, such as either solely in response to the applied electric field, or to assist in or be utilized in conjunction with a magnetic field or current-induced switching process.

1. Voltage Controlled Magnetic Anisotropy (VCMA) Switches.

FIG. 1 illustrates an in-plane VCMA switch embodiment 10, having the following layers, (metallic contacts are not shown). A ferromagnetic (FM) fixed layer 12, of ferromagnetic material, such as comprising Fe, Co, CoFe, or CoFeB. A ferromagnetic (FM) free layer 16, of ferromagnetic material, such as comprising Fe, Co, CoFe, or CoFeB. A dielectric (DE) tunnel barrier 14, of dielectric material, interposed between said FM free layer and FM fixed layer, such as comprising MgO. In the figure, the magnetic fields of the fixed and free layer are shown with opposite polarities. The overall structure resembles a magnetic tunnel junction (MTJ), and exhibits tunneling magnetoresistance (TMR) which allows for reading of the magnetic state of the FL by measuring the resistance across the stack, although the state of the switch is not current controlled.

It should be appreciated that each of the free and fixed layers may themselves comprise several sub-layers, that acting in combination provide the free or fixed layer functionality. An example is a synthetic antiferromagnetically coupled free or fixed layer, such as two CoFe or CoFeB films which are exchange-coupled through a thin metallic barrier such as Ruthenium (Ru). One of ordinary skill in the art will recognize that many such combinations can be configured to provide a fixed layer and a free layer. The free layer composition and capping (or seed) layers can be selected, such as to induce a large perpendicular magnetic anisotropy in it. Examples of capping or seed layer materials include Tantalum (Ta), Ruthenium (Ru), and Palladium (Pd), and composition examples include Fe-rich films such as $Co_{40}Fe_{40}B_{20}$ or $Co_{20}Fe_{60}B_{20}$. It should be appreciated that the above are provided by way of example only, and the invention is by no means limited to these materials or compositions as it can be practiced across a range of other materials.

The ferromagnetic free and fixed layers have an in-plane (IP) and an out-of-plane (OOP, also referred to as perpendicular) magnetic anisotropy. The OOP anisotropy is affected by the FM/DE interface properties, and can be controlled by electric fields (i.e., voltages) applied across the DE layer, thereby giving rise to a voltage-controlled magnetic anisotropy (VCMA) effect. The OOP anisotropy is increased or reduced depending on the characteristics of the applied voltage, and in this case the polarity of the applied voltage (i.e., direction of the electric field). The effect is opposite on the two sides of the DE barrier, for example if positive voltages increase the OOP anisotropy on one side they reduce it on the other side. The OOP anisotropy can additionally be tuned by controlling the FM composition (e.g., providing higher OOP anisotropy for higher Fe content in CoFeB), and the FM thickness (e.g., OOP anisotropy is larger for thinner films).

In the following descriptions, it should be appreciated that IP and OOP anisotropies represent tendencies of the magnetization to go into the IP or OOP state. Since both anisotropies are present in devices according to the invention, the actual state of the magnetization may differ from the IP and OOP configurations. Accordingly, it is important not to confuse axes of anisotropy and directions of magnetization, which may or may not be the same.

The present invention covers two types of the described VCMA switch, depending on the FM design and relative strength of OOP and IP anisotropies and the demagnetization fields in the sample. The first is an IP VCMA switch, in which the free and fixed layers are designed such that both have magnetization pointing in the plane. The second is an OOP VCMA switch, in which the free and fixed layers are designed such that both have magnetization pointing out of plane.

1.1 In Plane VCMA Switches.

FIG. 1 and FIG. 2A through 2D illustrate an IP VCMA switch embodiment 10. In this embodiment, the OOP anisotropy of the free layer 16 is designed to be larger than the OOP anisotropy of the fixed layer 12. It will be seen that a tunnel barrier 14, such as a dielectric material (e.g., MgO), is interposed between the FM free layer 16 (FM1) and FM fixed layer 12 (FM2). For one polarity of the applied voltage (e.g., negative), the OOP anisotropy of the FL increases, such that the FL magnetization turns out of the sample plane, or is otherwise changed from the IP state (e.g., by going to a nonuniform micromagnetic or domain state, or by starting a precessional motion around the effective magnetic field). Once this applied voltage is returned to zero, the magnetization returns to the IP state, but the direction in which it will point is determined by the stray magnetic field from the fixed layer. Negative applied voltages can therefore switch the VCMA switch from parallel (P) to anti-parallel (AP) configuration. Positive voltages with similar amplitude have no effect on the final magnetic state of the VCMA switch. The reverse switching direction can be attained using an opposite external magnetic field which over-compensates the stray magnetic field from the fixed layer. In addition, if the original pulse is timed to result in a precessional motion of the free layer magnetization, instead of an intermediate out-of-plane or micromagnetic domain state, then the final state is determined by the pulse width utilized, rather than by stray fields. In this case, pulses timed at approximately ½ of the precessional period, or an odd multiple thereof, will switch the bit to the opposite state (P to AP, or AP to P), while pulses timed at one or multiple full precessional periods will not switch it. It should be noted that the pulse widths can deviate up to about 20% from the ½ precessional period, or multiple thereof, and still be effective. In the absence of external magnetic fields or very short voltage pulses (less than about 1-5 ns), each of these switches performs voltage-controlled switching only in one direction. Switching in the opposite direction can be performed by other means, such as a magnetic field or spin polarized current.

In FIG. 2A voltage-induced switching is seen in response to a negative voltage pulse, −V1 pulse 18. The transition from the parallel (P) state to the final anti-parallel (AP) state (magnetic orientation arrows for the fixed and free layers seen in opposite directions) are determined by the overall magnetic field acting on the free layer, including the magnetic coupling field from the fixed layer.

In FIG. 2B it is seen that in response to application of the same voltage pulse, that switching in the reverse direction of FIG. 2A does not take place, as the final state is still determined by the same magnetic field as in FIG. 2A, wherein the free layer remains in the AP state.

FIG. 2C and FIG. 2D illustrate that applying an opposite voltage polarity, herein shown as +V1 pulse 20, also does not switch the magnetization state in the free layer, regardless of whether the initial state of the free layer is P or AP.

The operation of an in-plane switch described for FIG. 2A through FIG. 2D assumes that the stray field acting on the free layer (FM1) 16 favors the anti-parallel state, which is the case if it is dominated by magnetic dipole interaction. The operation is analogous if the field favors the parallel magnetization state, in which case the starting state would be anti-parallel. This initial state is defined by $K_{perp, FM1}$ (V=0)>$K_{perp, FM2}$ (V=0), where $K_{perp}$ denotes the voltage-dependent perpendicular anisotropy of each of the layers FM1 and FM2.

An electric field (i.e., voltage), depicted as pulse −V1, is applied across the dielectric (e.g., MgO) which enhances the perpendicular anisotropy on the free layer side and reduces it on the fixed layer side. This applied voltage generates no magnetization change on the fixed layer side, while rotating the magnetization of the free layer out of plane, allowing it to be switched by the stray field from the fixed layer, as seen on the right side of FIG. 2A.

The difference between the terms "rotation" and "switching" should be appreciated. The term rotation, is meant herein to preferably refer to a 90 degree rotational change, although it can be somewhat less but is usually more than a 45 degree rotational change from the stable state (i.e., from in-plane toward out-of-plane or from out-of-plane toward in-plane). The term "switching", on the other hand, refers to a full 180 degree reorientation of the magnetization. Hence, when rotation by the applied voltage is referred to, this only constitutes part of the full switching, which allows the stray field to then take it the remainder of the way to the full 180 degree switch. (i.e., 180°=90° (V)+90° (stray field) or 85° (V)+95° (stray field), and so forth.)

The voltage needed to accomplish this switching is determined by the out-of-plane demagnetizing field (hence free layer saturation magnetization) and is quantified by $K_{perp,FM1}(V=-V1)>2\pi M_{s,FM1}^2$ where $M_{s,FM1}$ is the saturation magnetization of the layer FM1 and $K_{perp,FM1}$ denotes the voltage-dependent perpendicular anisotropy in layer FM1. A more complex micromagnetic nonuniform state or intermediate precessional motion may also occur as a result, which can similarly be used to switch the magnetization.

Application of an electric field (i.e., voltage) across the dielectric (e.g., MgO) in the opposite direction, depicted as an applied +V1 pulse in FIG. 2C and in FIG. 2D, enhances the perpendicular anisotropy on the fixed layer side and reduces it on the free layer side. However, since the fixed layer perpendicular anisotropy is designed to be too small to turn the magnetization out of plane within the operating voltage range of the device, this does not lead to switching as seen by the result on the right sides of FIG. 2C, and FIG. 2D showing no resultant state change regardless of the relative polarizations of the fixed and free layers. In practice, this criterion can be met by designing the fixed layer thickness and composition to lead to a small enough perpendicular anisotropy.

It should be appreciated that the voltage induced switching described herein is unidirectional, as the direction of the stray magnetic field on the free layer is fixed. Switching in the opposite direction can be performed by other means, including that of current or magnetic field switching.

The above descriptions correspond to purely voltage-induced switching.

However, the same mechanism can be utilized to aid in current-induced or field-induced switching of magnetic tunnel junctions, such as reducing the write current required in spin transfer torque memory cells or other types of MRAM.

1.2 Perpendicular VCMA Switches.

FIG. 3 and FIG. 4A through FIG. 4D illustrate an OOP VCMA switch embodiment 30, having a fixed layer 32 (FM2) and free layer 36 (FM1) separated by a tunnel barrier 34. In this embodiment, the OOP anisotropy of the free layer is designed to be smaller than the OOP anisotropy of the fixed layer. For one polarity of the voltage (e.g., positive), the OOP anisotropy of the FL can be reduced, such that the FL magnetization turns into the sample plane, or is otherwise changed from the OOP state, for example by going to a nonuniform micromagnetic or domain state, or by starting a precessional motion around the effective magnetic field. Once this voltage is returned to zero, the magnetization returns to the OOP state, but the direction in which it will point is determined by the stray magnetic field from the fixed layer.

Positive voltages, as in +V1 pulse 38 in FIG. 4B, can therefore cause switching from anti-parallel (AP) to parallel (P) configuration, as seen by the arrows changing from AP on the left to P on the right of that figure. Applying a positive voltage, such as +V1 pulse to the P configuration, as seen in FIG. 4A, does not result in any change as seen on the right side of that figure. Applying negative voltages with similar amplitude, such as −V1 pulse 40 seen in FIG. 4C and FIG. 4D, has no effect on the final magnetic state of the device, regardless whether the switch was in a P or an AP configuration. The reverse switching direction can be attained, for example, using an opposite external magnetic field which over-compensates the stray magnetic field from the fixed layer. In addition, if the original pulse is timed to result in a precessional motion of the free layer magnetization, rather than an intermediate in-plane or micromagnetic domain state, the final state is determined by the pulse width instead of by stray fields. In this case, pulses timed at approximately ½ of the precessional period, or an odd multiple thereof, will switch the bit to the opposite state (P to AP or AP to P), while pulses timed at one or multiple full precessional periods will not switch it. It should be noted that response to pulse period is only applicable to a precessional switching mechanism, while the non-precessional switching mechanism does not depend on pulse period.

At least one embodiment of the invention describes the realization of a magneto-electric (ME) magnetic Random Access Memory (MeRAM), which is voltage-controlled rather than current-controlled. This is a scalable alternative to other MRAM designs, such as those based on spin transfer torque (STT-MRAM) or thermally-assisted switching (TAS-MRAM). Due to the lack of transfer of charges through the dielectric barrier, MeRAM can be orders of magnitude more energy efficient and scalable than these other forms of magnetic switching, while retaining all other advantages of MRAM such as nonvolatility, high speed, high endurance, and high density. The present invention is particularly well-suited for nonvolatile memory applications where low energy consumption is critical. Examples include, but are not limited to, embedded memory in mobile communication and computing systems, as well as medical implants and sensors.

One preferred way of practicing the invention is to realize the MeRAM bit as a VCMA switch, with additional modifications to the fixed layer and/or tunnel barrier, described below for both OOP and IP MeRAM, to allow for Bidirectional voltage-induced switching. In at least one embodiment, this magnetic bit is integrated with CMOS circuits to perform the write operation (applied voltage) and read operation (readout of the resistance across the VCMA switch).

The switch described in this report utilizes the following key effects. The existence of a perpendicular-to-plane magnetic anisotropy at the interface of a ferromagnetic and a dielectric material. An example material system consists of CoFeB and MgO, where typically higher Fe content in the CoFeB ferromagnet leads to larger perpendicular anisotropy. The possibility to design this perpendicular anisotropy by adjusting composition, shape and thickness of the ferromagnet allows for the realization of two ferromagnetic (e.g., CoFeB) layers on both sides of the dielectric which can be switched at different voltages, thereby acting as free and fixed layers in the device. The anisotropy depends on the electric field at the interface (e.g., CoFeB—MgO interface), and hence is dependent on the voltage applied across the DE layer (e.g., MgO). A memory device can rely on a readout using the phenomenon of tunneling magnetoresistance (TMR), wherein resistance of the device is dependent on the relative orientation of the free and fixed layers. Previous MRAM devices relied, however, on switching performed in response to a substantial current flow, such as current through the MTJ stack in an STT-RAM, or through an adjacent conductor in the case of Toggle MRAM. Yet in the present invention, the nonzero overall stray magnetic field (e.g., consisting of dipole, exchange, and surface roughness contributions) acting on the free layer, allows it to be switched if it is prepared into an unstable state by application of a voltage pulse.

The operation of a perpendicular switch is described below for FIG. 4A through 4D. The initial state is defined by:

$$K_{perp,FM1}(V=0) < K_{perp,FM2}(V=0)$$

where $K_{perp}$ denotes the voltage-dependent perpendicular anisotropy of each of the layers FM1 and FM2.

In FIG. 4A the perpendicular magnetization states are in a parallel (P) direction to one another, and in response to application of an electric field (i.e., voltage), depicted as a +V1 pulse, applied across the dielectric (DE) (e.g., MgO) there is no change to the magnetization states, wherein it remains in the parallel (P) state as seen on the right side of that figure.

In FIG. 4B the device is seen at left starting out in the anti-parallel (AP) magnetization state with the perpendicular fields in opposite orientations. It is assumed that the stray field acting on the free layer (FM1) favors the parallel state, which is the case if it is dominated by magnetic dipole interaction. The operation is analogous if the field favors the anti-parallel magnetization state, in which case the starting state would be parallel.

An electric field (i.e., voltage), depicted as a +V1 pulse, is applied across the dielectric (e.g., MgO) which enhances the perpendicular anisotropy on the fixed layer side and reduces it on the free layer side. This results in no magnetization change on the fixed layer side, while rotating the magnetization of the free layer into the plane, allowing it to be switched by the stray field from the fixed layer, as seen on the right side of FIG. 4B to a parallel (P) state. The voltage needed to accomplish this switching (AP to P) is determined by the out-of-plane demagnetizing field (hence free layer saturation magnetization), which is given by the following:

$$K_{perp,FM1}(V=+V1) < 2\pi M_{s,FM1}^2.$$

In the above relation $M_{s,FM1}$ is the saturation magnetization of the layer FM1 and $K_{perp,FM1}$ denotes the voltage-dependent perpendicular anisotropy in layer FM1.

A more complex micromagnetic nonuniform state or intermediate precessional motion may also occur as a result, which can similarly be used to switch the magnetization.

Application of an electric field (i.e., voltage), shown as −V1 pulse in FIG. 4C through FIG. 4D across the dielectric (e.g., MgO) in the opposite direction enhances the perpendicular anisotropy on the free layer side and reduces it on the fixed layer side. However, since the fixed layer perpendicular anisotropy is designed to be too large to turn the magnetization into plane within the operating voltage range of the device, this will not lead to switching regardless of the relative magnetization orientations of the fixed and free layers as seen on the right of FIG. 4C and FIG. 4D.

As in the previous embodiment, the voltage induced switching provided is unidirectional, as the direction of the stray magnetic field on the free layer is fixed. Switching in the opposite direction for this embodiment can be performed by other means (e.g., current or magnetic field).

The above description corresponds to purely voltage-induced switching, however, the same mechanism can be utilized to aid current-induced switching of magnetic tunnel junctions, toward for example reducing the write current required in spin transfer torque memory cells.

2. MeRAM Bit Embodiment.

These embodiments of the invention comprise a memory cell in which information is stored in the state of a magnetic bit (i.e., in a free layer). The magnetization of the free layer can be switched from one state to another using an applied voltage, such as solely in response to application of an electric field, or in conjunction with a magnetic field or current-induced switching process. Switching can be performed according to these embodiments in both directions in response to voltage control.

2.1 In-Plane MeRAM Bit Switching.

FIG. 5, FIG. 6A through FIG. 6D, and FIG. 7A through FIG. 7D illustrate an embodiment 50 of an in-plane MeRAM bit, and its switching in two configurations. The MeRAM bit is shown comprising FM and DE layers of various compositions. It will be noted that the description does not describe the use of metal contact layers for the sake of simplicity, although one of ordinary skill in the art will appreciate the need of these contacts, such as on the two sides (top and bottom) of the entire layer stack.

In FIG. 5 the ferromagnetic layers are shown comprising a ferromagnetic semi-fixed layer 54 (FM3), a ferromagnetic fixed layer 58 (FM2), and a ferromagnetic free layer 62 (FM1). The MeRAM bit is shown comprising FM and DE layers of various compositions. The moniker of 'semi-fixed' layer is utilized because the magnetization for this layer can rotate for some applied voltages, but not for others. It will be noted that the description does not describe the use of metal contact layers for the sake of simplicity, although one of ordinary skill in the art will appreciate the need of contacts. It should be appreciated that by way of example and not limitation, each of these FM layers may comprise Co, Fe, CoFe or CoFeB. Non-magnetic (dielectric or metal) layers 52, 56 and 60 are seen at the top of the device and between each pair of FM layers, providing tunneling barrier and spacer layers.

Optionally, the fixed and semi-fixed layers may or may not be exchange-coupled through a metallic barrier film (e.g., Ruthenium (Ru)). They can also be separated by an ordinary metal (e.g., Tantalum (Ta)) and thus only be dipole-coupled, such as described later in regards to FIG. 25. The overall structure resembles a magnetic tunnel junction (MTJ), and exhibits tunneling magnetoresistance (TMR) which allows for reading of the magnetic state of the FL by measuring the resistance across the stack.

It should also be appreciated that each of the free, semi-fixed and fixed layers may itself consist of several sub-layers, which, acting together provide the free or fixed layer functionality. An example is a synthetic antiferromagnetically coupled free, semi-fixed, or fixed layer, for instance comprising, but not limited to, two CoFe or CoFeB films which are exchange-coupled through a thin metallic barrier such as Ruthenium (Ru).

The ferromagnetic layers have an in-plane (IP) and an out-of-plane (OOP) perpendicular anisotropy. The OOP anisotropy is affected by the FM/DE interface properties, and can be controlled by electric fields (i.e., voltages) applied across the DE layer. The OOP anisotropy is increased or reduced depending on the polarity of the applied voltage (i.e., direction of the electric field). The effect is opposite on the two sides of the DE barrier, such that if positive voltages increase the OOP anisotropy on one side of the barrier they reduce it on the other side. The OOP anisotropy can additionally be tuned by controlling the FM composition (e.g., higher OOP anisotropy for higher Fe content in CoFeB), and the FM thickness (e.g., OOP anisotropy is larger for thinner films).

The free, fixed, and semi-fixed layers are designed such that they have magnetization pointing in the plane, with the OOP anisotropy of the free layer designed to be largest, and the OOP anisotropy of the fixed layer the smallest, with the semi-fixed layer having an intermediate OOP anisotropy value.

For one polarity of the voltage (e.g., negative), the OOP anisotropy of the FL can be increased such that the FL magnetization turns out of the sample plane. Once this voltage is returned to zero, the magnetization returns to the IP state, but the direction in which it will point is determined by the stray magnetic field from the combination of the fixed and semi-fixed layers. For a larger applied voltage of the same polarity (e.g., negative), the semi-fixed layer will also be turned out of plane. In this case the final direction of the FL will be determined only by the stray field from the fixed layer, since the semi-fixed layer provides a reduced or zero horizontal component to the stray field. The fixed/semi-fixed layer combination is designed in such a way so that these two cases provide stray fields in different directions. Negative voltages can therefore switch the VCMA switch from parallel (P) to anti-parallel (AP) configuration and vice versa, depending on the applied voltage amplitude. Positive voltages with similar amplitude have no effect on the final magnetic state of the VCMA switch.

This embodiment of MeRAM performs anti-parallel (AP) to parallel (P) switching in response to application of a −V1 pulse, while applying a −V2 pulse performs P to AP switching. Pulses having a voltage larger than −V1 (less negative) do not allow any switching. The relations for this are as follows:

$$K_{perp,FM1}(V=0) > K_{perp,FM3}(V=0) > K_{perp,FM2}(V=0);$$

$$K_{perp,FM1}(V=-V1) > 2\pi M_{s,FM1}^2;$$

$$K_{perp,FM3}(V=-V2<-V1) \sim 2\pi M_{s,FM3}^2.$$

In the above relations, $K_{perp}$ and $M_s$ denote the voltage-dependent perpendicular anisotropy, and the saturation magnetization, respectively, for each of the three ferromagnetic layers. The first relationship defines the standby condition of the device, with the free layer having the highest perpendicular anisotropy, followed by the semi-fixed and fixed layers, respectively. The second and third relationships define the conditions for turning the free and semi-fixed layers, respectively, out of the sample plane by an applied voltage.

In FIG. 6A a −V1 pulse 64 is applied to the MeRAM in an initial state (reset condition) of free layer 62 which is a parallel (P) state, and as seen in the right side of the figure, the final state is unchanged. However, as seen in FIG. 6B, the application of a larger pulse −V2 66 changes the magnetization of free layer 62, and the state of the cell to a set state, as seen in the right side of that figure in which the direction of the FL has been switched from parallel (P) to anti-parallel (AP). Once set, the application of a −V1 pulse 64 as seen in FIG. 6C, causes a reset returning the cell to a parallel field direction of free layer 62. In FIG. 6D it is seen that application of the −V2 66 pulse, when free layer 62 is in the anti-parallel direction (AP), has no effect on the output as free layer 62 remains in the anti-parallel (AP) direction, wherein cell state is unchanged.

In FIG. 7A through 7D is seen an analogous case to that of FIG. 6A through FIG. 6D, for the opposite fixed/semi-fixed layer combination. In FIG. 7C a −V1 pulse 64 is applied to the MeRAM in an initial state (reset condition) of free layer 62 in a parallel (P) state, and as seen in the right side of the figure, the state remains unchanged in the P state. However, as seen in FIG. 7D, the application of a larger pulse of −V2 66 changes the magnetization of free layer 62, and the state of the cell to a set state, as seen in the right side of that figure, in which the direction of the FL has been switched from parallel (P) to anti-parallel (AP). Once set, the application of a −V1 pulse 64 as seen in FIG. 7A, causes a reset returning the cell to a parallel (P) field direction of free layer 62. In FIG. 7B it is seen that application of the −V2 66 pulse, when free layer 62 is in the anti-parallel (AP) direction, has no effect on the output as free layer 62 remains in the anti-parallel (AP) direction, wherein cell state is unchanged.

It can be seen from the above that the present invention thus describes a MeRAM bit design where unipolar set/reset voltage pulses can switch the bit magnetization in opposite directions. Voltages of the opposite polarity do not affect the free layer state. The opposite polarity can thus be used for readout of the magnetic bit information using the TMR effect with very low read-induced false switching events, leading to a low read disturb rate.

2.2 Out-of-Plane MeRAM Bit Switching.

In this embodiment of the invention information is stored in a memory cell as the state of a magnetic bit (i.e., in a free layer, FL) having a perpendicular-to-plane magnetization. The magnetization of the FL can be switched from one orientation (representing a first cell state) to another orientation (representing a second cell state) in response to an applied voltage. In at least one embodiment, the cell state is solely determined in response to the applied voltage pulses, while other embodiments can utilize the applied voltage pulses in conjunction with a magnetic field or current-induced switching process. Switching can be performed in both directions only by applying a voltage.

FIG. 8, FIG. 9A through FIG. 9D, and FIG. 10A through FIG. 10D illustrate an embodiment 70 of a perpendicular MeRAM bit, and its switching. The MeRAM bit is shown comprising FM and DE layers of various compositions. It will be noted that the description does not describe the use of metal contact layers for the sake of simplicity, although one of ordinary skill in the art will appreciate the need of these contacts, such as connected on the two sides (top and bottom) of the stack of layers. The magnetic memory bit consists of various FM layers with interposed dielectrics or metal layers.

In FIG. 8, the ferromagnetic (FM) layers are seen comprising a semi-fixed layer 74 (FM3), a fixed layer 78 (FM2), and a free layer 82 (FM1). Each of these FM layers may by way of example comprise Co, Fe, CoFe, or CoFeB materials. A non-magnetic dielectric (DE) or metal layer 72, 76, 80 (e.g. MgO, Ta) is shown at the top and between each pair of the FM layers as a tunnel barrier, and/or spacer layer.

The fixed and semi-fixed layers may or may not be exchange-coupled through a metallic film (e.g., Ru). They can also be separated by an ordinary metal such as Ta and thus only be dipole-coupled. The overall structure resembles a magnetic tunnel junction (MTJ), and exhibits tunneling magnetoresistance (TMR) which allows for reading of the magnetic state of the FL by measuring the resistance across the stack.

The ferromagnetic layers have an in-plane (IP) and an out-of-plane (OOP) perpendicular anisotropy. The OOP anisotropy is affected by the FM/DE interface, and can be controlled by electric fields (i.e., voltages) applied across the DE layer. The OOP anisotropy is increased/reduced depending on the polarity of the applied voltage (i.e., direction of the electric field). The effect is opposite on the two sides of the DE barrier, such that if positive voltages increase the OOP anisotropy on one side they reduce it on the other side. The OOP anisotropy can additionally be tuned by controlling the FM composition (e.g., higher OOP anisotropy for higher Fe content in CoFeB), and the FM thickness (OOP anisotropy is larger for thinner films).

In this portion of the invention, a perpendicular, such as an out-of-plane (OOP), VCMA switch based memory bit is described. In this perpendicular MeRAM bit cell, the free, fixed, and semi-fixed layers are designed such that they have magnetization pointing perpendicular to the sample plane.

In this embodiment, the OOP anisotropy of the free layer is designed to be smallest, and the OOP anisotropy of the fixed layer is largest, with the semi-fixed layer having an intermediate OOP anisotropy value. For one polarity of the voltage (e.g., positive), the OOP anisotropy of the FL can be reduced such that the FL magnetization turns into the sample plane. Once this voltage is returned to zero, the magnetization returns to the OOP state, but the direction in which it will point is determined by the stray magnetic field from the combination of the fixed and semi-fixed layers. For a larger applied voltage of the same polarity (e.g., positive), the semi-fixed layer will also be turned into the plane. In this case the final direction of the FL will be determined only by the stray field from the fixed layer, since the semi-fixed layer provides a reduced or zero vertical component to the stray field. The fixed/semi-fixed layer combination is designed in such a way so that these two cases provide stray fields in different directions. Positive voltages can therefore switch the VCMA switch from parallel (P) to anti-parallel (AP) configuration and vice versa, depending on the applied voltage amplitude. Negative voltages with similar amplitude have no effect on the final magnetic state of the VCMA switch.

This embodiment of MeRAM performs anti-parallel (AP) to parallel (P) switching in response to application of a +V1 pulse, while applying a +V2 pulse performs P to AP switching. Pulses having a voltage less than +V1 do not lead to any switching. The relations for this are as follows:

$$K_{perp,FM1}(V=0) < K_{perp,FM3}(V=0) < K_{perp,FM2}(V=0);$$

$$K_{perp,FM1}(V=+V1) < 2\pi M_{s,FM1}^2;$$

$$K_{perp,FM3}(V=+V2<+V1) \sim 2\pi M_{s,FM3}^2.$$

Again in the above relation $K_{perp}$ and $M_s$ denote the voltage-dependent perpendicular anisotropy, and the saturation magnetization, respectively, for each of the three ferromagnetic layers. The first relationship defines the standby condition of the device, with the free layer having the lowest perpendicular anisotropy, followed by the semi-fixed and fixed layers, respectively. The second and third relationships define the conditions for turning the free and semi-fixed layers into the sample plane by an applied voltage, respectively.

In FIG. 9A a +V1 pulse 84 is applied to the MeRAM in an initial parallel (P) state (reset condition) of free layer 82 to change the magnetization of the FL layer 82 to anti-parallel (AP) as seen in the right side of the figure. In FIG. 9B, it is seen that the application of a larger pulse+V2 86 does not change the initial state of magnetization of free layer 82, and the state is seen unchanged in the right side of that figure. Once set, as seen in FIG. 9C, the application of a +V1 pulse 84 does not affect the cell state, as seen in the right of the figure. In FIG. 9D, from the set state, the application of a +V2 pulse (+V2 >+V1) changes the magnetization of the FL 82 back to parallel (P), resetting device state.

In FIG. 10A through FIG. 10D an analogous case is shown for the opposite fixed/semi-fixed layer combination. In FIG. 10C a +V1 pulse 84 is applied to the MeRAM in an initial state (reset condition) of parallel (P) of free layer 82 to change the magnetization of the FL layer 82 to anti-parallel (AP) as seen in the right side of the figure. In FIG. 10D, it is seen that the application of a larger pulse+V2 86 does not change the initial state of magnetization of free layer 82, and the state is seen unchanged in the right side of that figure. Once set, as seen in FIG. 10A, the application of a +V1 pulse 84 does not affect the cell state, as seen in the right of the figure. In FIG. 10B, from the set state, the application of a +V2 pulse (+V2 >+V1) changes the magnetization of the FL 82 back to parallel (P), resetting the device state.

This invention thus describes a MeRAM bit design where unipolar set/reset voltage pulses can switch the bit magnetization in opposite directions. It is important to appreciate that applying voltages of the opposite polarity does not affect the free layer state; whereby opposite polarity signals can be utilized for reading out the magnetic state of the bit using the TMR effect with very low read-induced false switching events, leading to a low read disturb rate. It will be appreciated that this use of reverse voltages for reading the MeRAM is an important advantage of this embodiment.

3. Bi-Directionally Switched MeRAM Utilizing Field-Like Spin Torque.

In this embodiment of the invention information is stored in the state of a magnetic bit (i.e., in a free layer, FL), having an in-plane or out-of-plane magnetization. The magnetization of the FL can be switched from one state to another using an applied voltage (i.e., electric field), which modifies the perpendicular anisotropy of the free layer. The direction of switching is determined by the magnitude of the applied voltage, which determines the amount of leakage current passing through the device. The field-like spin torque (as well as, to a lesser extent, the regular spin torque) induced by the leakage current is utilized to determine the direction of switching.

This invention describes the building block for the realization of a magneto-electric (i.e., voltage-controlled rather than current-controlled) magnetic Random Access Memory (MeRAM).

The MeRAM can have the same configuration as previously described in FIG. 1, with a free layer 16 (FM1), fixed layer 12 (FM2), and a dielectric (DE) tunnel barrier 14 (e.g., MgO), interposed between the ferromagnetic (FM) layers.

Figure 18:
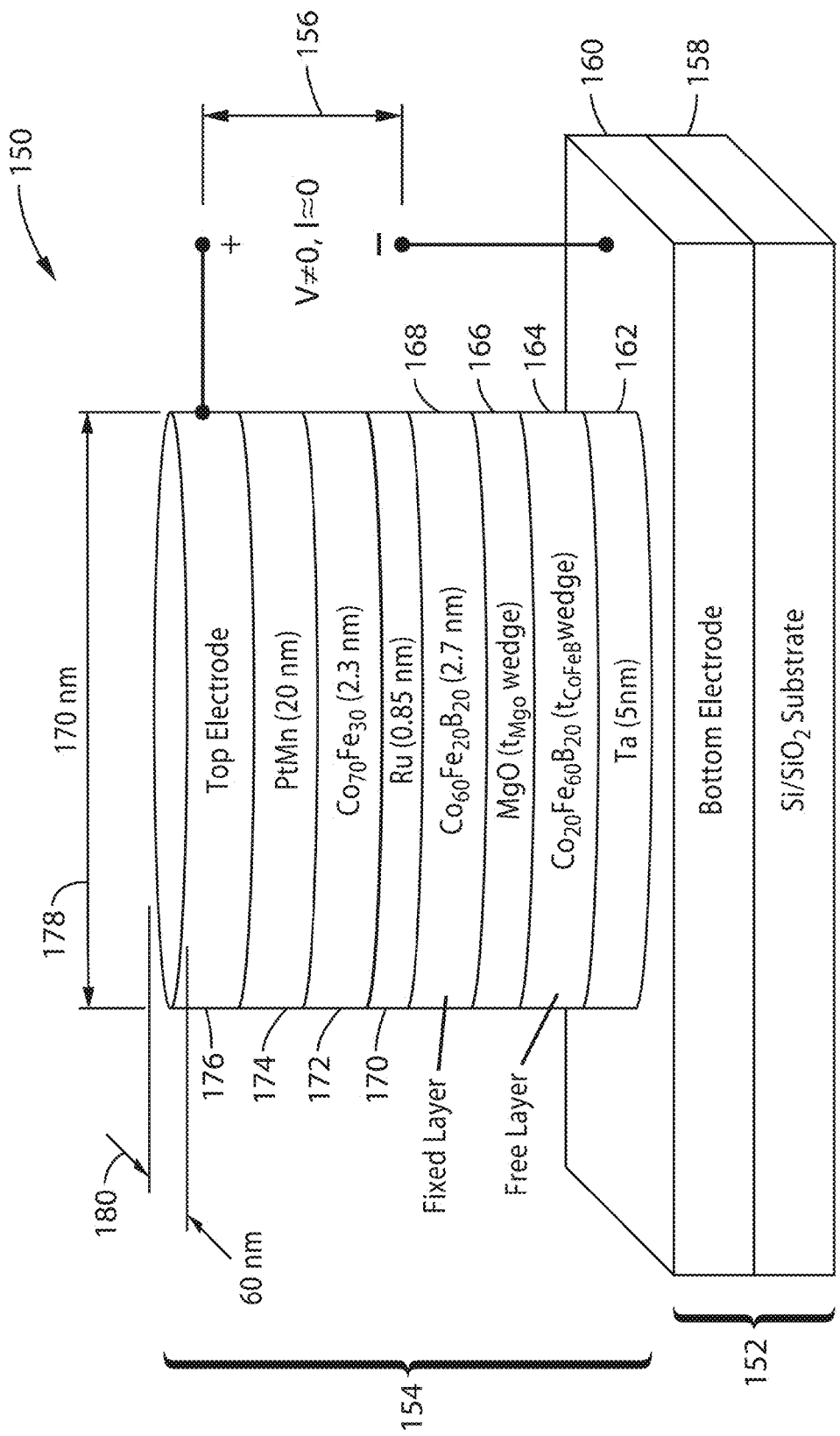
FIG. 18 is a schematic of a MeRAM memory bit according to an embodiment of the present invention, showing a dielectric layer interposed between a ferromagnetic free layer and fixed layer.
Figure 25:
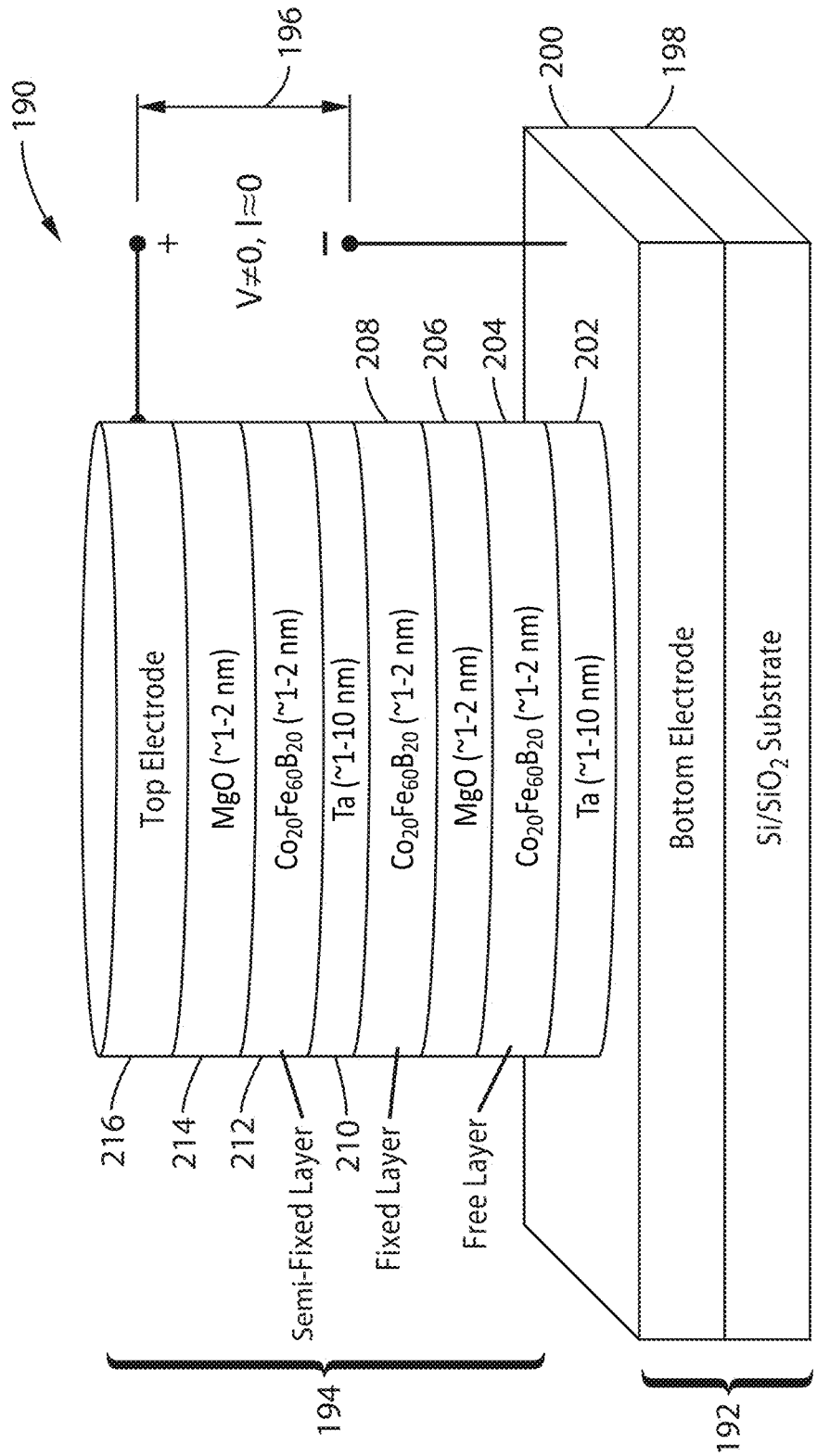
FIG. 25 is a schematic of a MeRAM memory bit with free layer, fixed layer, and semi-fixed layers according to an embodiment of the present invention.

It will be noted that, for the sake of simplicity of description, the connection of metal contact layers is not shown, although one of ordinary skill in the art will appreciate the need of these contacts. These contacts would be normally placed on the two sides (top and bottom) of the entire layer stack, such as represented in FIG. 18 and FIG. 25. It will be seen, therefore, that the magnetic memory bit consists of various FM layers with interposed dielectrics or metal layers.

Each of the free and fixed layers may itself consist of several sub-layers, which, acting together, provide the free or fixed layer functionality. An example is a synthetic antiferromagnetically coupled free or fixed layer, for instance comprising two CoFe or CoFeB films, which are exchange-coupled through a thin metallic barrier such as Ruthenium (Ru).

The fixed layer may or may not be configured for exchange using an anti-ferromagnetic film (e.g., Platinum-Manganese (PtMn) or Iridium-Manganese (IrMn)). It may also be replaced by a synthetic anti-ferromagnet (SAF) material. The overall structure resembles a magnetic tunnel junction (MTJ), and exhibits tunneling magnetoresistance (TMR) which allows for reading of the magnetic state of the FL by measuring the resistance across the stack, yet is not configured for switching the device in response to current flow. The DE layer is chosen to be sufficiently thick to allow only small leakage current flow when voltages lower than the breakdown voltage are applied. However, it is also chosen to be thin enough to provide sufficient leakage current (hence field-like spin torque) to allow the latter to influence the switching direction.

The ferromagnetic free layer (FL) has an in-plane (IP) and an out-of-plane (OOP) perpendicular anisotropy. The OOP anisotropy is affected by the FM/DE interface, and can be controlled by the electric field (i.e., voltage) applied across the DE layer. The OOP anisotropy is increased/reduced depending on the polarity of the applied voltage (i.e., direction of the electric field). The OOP anisotropy can additionally be tuned by controlling the FM composition (e.g., higher OOP anisotropy for higher Fe content in CoFeB), and the FM thickness (e.g., OOP anisotropy is larger for thinner films).

Following are a number of key elements of this element of the invention. The small leakage current through the device leads to a field-like spin torque (as well as a regular spin torque), which affects the device in a manner that is equivalent to an applied magnetic field. The magnitude of this field (i.e., amount of leakage current) is controlled by the magnitude of the switching voltage applied to the device, or more specifically, across the FM layers, such as preferably across the metal contacts on top and bottom of the stack. The key difference with respect to FIG. 1, or the other previous embodiments, is in the thickness of the dielectric barrier, which in this case still allows for some leakage currents to flow.

By tuning the leakage current (hence tuning this effective field), different voltages applied to the device lead to different directions of switching. In technical terms, the field-like torque shifts the center of the easy axis resistance versus magnetic field hysteresis loop of the devices, thereby making it favor either the parallel (P) or the anti-parallel (AP) state. It should be realized that to a lesser extent, this shift can be realized through regular spin torque which is also present in the inventive devices. Since the field-like torque increases with current, the direction that is favored depends on the amount of leakage current passing through the device, and is therefore controlled by the applied voltage. Only a small leakage current is required for device operation, as the current is only utilized to select the switching direction, and not to bring about the switching. The switching is activated by voltage (rather than current), which puts the FL in a meta-stable state by modifying its perpendicular anisotropy.

It should be realized that this invention is distinct from spin transfer torque (STT) memory, since the switching is voltage-induced rather than current-induced, and the small leakage current is only used to determine the direction of switching, and not to activate the switch. Hence, this invention provides more energy-efficient switching compared to STT memory, as it uses much smaller currents. In addition, regular STT is not needed for this device to work and field-like-torque alone is in fact sufficient to determine the direction of the voltage-activated switching.

This invention is also distinct from the MeRAM embodiments described in previous sections, since in those cases an actual (internal or external to the device) magnetic field is used to determine the direction of switching, while in this invention this is replaced by a small current-induced torque, which is more easy and reliable to implement technologically.

The following describes an alternative for determining the direction of switching for utilizing field-like torque, which operates with the embodiments described in previous sections.

Figure 11A:
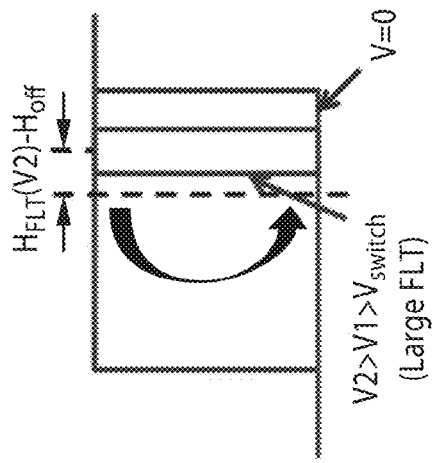
FIG. 11A through FIG. 11C are graphs of coercivity of a MeRAM memory cell according to an embodiment of the present invention.
Figure 11B:
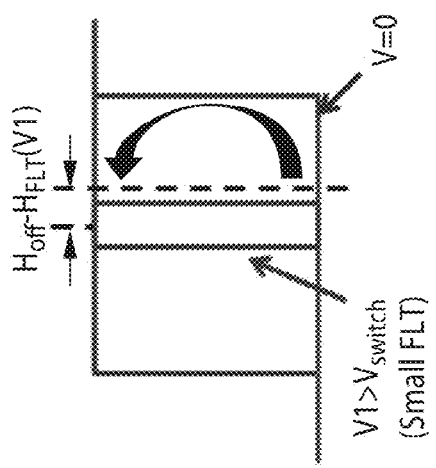
Figure 11C:
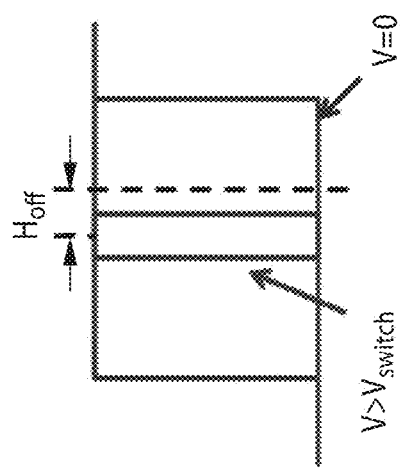

FIG. 11A through FIG. 11C depicts coercivity of a MeRAM bit utilizing field-like torque (FLT). In these figures a hysteresis loop is shown representing resistance versus easy axis magnetic field characteristics of the device, which are voltage-dependent. The voltage applied across the tunnel barrier reduces the coercivity and puts the device in a meta-stable state, the amount of leakage current (hence magnitude of field like torque compared to the offset field) determines the switching direction.

The device has a non-zero offset field ($H_{off}$) due to dipole and/or Neel coupling and/or exchange interaction between the free and fixed layers. For voltages where the hysteresis due to the leakage-induced field-like torque (FLT) (as well as any regular STT) is smaller than this offset field, the offset field determines the direction of switching, while for larger voltages FLT is large enough to cause the device to switch in the opposite direction. This is shown in FIG. 11A through FIG. 11C, where the effect of FLT is represented by the resistance versus field loop moving horizontally, (i.e., similar to an effective magnetic field). The effect of the voltage itself, on the other hand, is to put the device in a meta-stable state by reducing its coercivity. Both switching voltages, while different in terms of the induced FLT, must be large enough to destabilize the free layer by overcoming the FL demagnetizing field (for IP devices) or its perpendicular anisotropy (for OOP devices).

In FIG. 11A the applied voltage, V, is greater than the switching threshold voltage, $V_{switch}$, hence putting the free layer in an unstable state, where it is ready to switch. In FIG. 11B the applied voltage, V1, is greater than the switching threshold voltage, $V_{switch}$, wherein the leakage-induced shift is smaller than the offset field, so that a parallel (P) to anti-parallel (AP) switching occurs. In FIG. 11C the applied voltage, V2, is greater than applied voltage V1, which is greater than the switching threshold voltage, $V_{switch}$, wherein the leakage-induced shift is larger than the offset field, so that an anti-parallel (AP) to parallel (P) switching occurs.

FIG. 12, and FIG. 13A through FIG. 13D illustrate switching configurations of an in-plane MeRAM bit embodiment 110 utilizing field like torque. In FIG. 12 the MeRAM structure is shown with fixed layer 112 (FM2), free layer 116 (FM1), between which is interposed a barrier layer 114.

In FIG. 13A through FIG. 13D, switching is shown in response to the magnitude of the applied voltage of appropriate polarity by modifying the field like torque. The requirements for switching are as follows:

$$K_{perp,FM1}(V=0) > K_{perp,FM2}(V=0);$$

$$K_{perp,FM1}(V=V2) > K_{perp,FM1}(V=V1) > 2\pi M_{s,FM1}^2;$$

$$H_{FLT}(V1) < H_{off} < H_{FLT}(V2).$$

In the above relation $K_{perp}$ and $M_s$ denote the voltage-dependent perpendicular anisotropy, and the saturation magnetization, respectively, for each of the ferromagnetic layers. The first relationship defines the standby condition of the device, with the free layer having the higher perpendicular anisotropy. The second relationship defines the condition for voltage-induced switching, for instance that the voltage-controlled perpendicular anisotropy in the free layer is larger than its demagnetizing field, thereby putting it in an unstable state for both switching voltages V1 and V2. The third relationship defines that the voltage-dependent (leakage-induced) shift of the hysteresis loops $H_{FLT}$ as being smaller/larger than the offset (internal device) field $H_{off}$ for voltages V1 and V2, respectively, in order to achieve bidirectional switching.

In FIG. 13A application of a first voltage, V1 pulse 118, changes FL from a P state to an AP state. An additional application of first voltage V1 pulse 118 as seen in FIG. 13B, does not change the state of the FL layer. The application of a larger V2 pulse 120 is shown in FIG. 13C changing the AP state back to the P state, although it does not alter the FL state of the parallel state which is seen as unchanged in FIG. 13D.

It should be noted that there are different requirements on the voltage-controlled magnetic anisotropy $K_{perp}$ compared to previous sections, in view of the different magnetization configuration.

FIG. 14, and FIG. 15A through FIG. 15D illustrate switching for an out-of-plane (perpendicular) MeRAM bit embodiment 130 utilizing field like torque. In FIG. 14 the MeRAM structure is shown with fixed layer 132 (FM2), free layer 136 (FM1), between which is interposed a barrier layer 134.

In FIG. 15A through FIG. 15D, switching is shown in response to the magnitude of the applied voltage of appropriate polarity by modifying the field like torque. The requirements for switching are as follows:

$$K_{perp,FM1}(V=0) < K_{perp,FM2}(V=0);$$

$$K_{perp,FM1}(V=V2) < K_{perp,FM1}(V=V1) > 2\pi M_{s,FM1}^2;$$

$$H_{FLT}(V1) < H_{off} < H_{FLT}(V2).$$

In the above relationships, $K_{perp}$ and $M_s$ denote the voltage-dependent perpendicular anisotropy, and the saturation magnetization, respectively, for each of the ferromagnetic layers. The first relationship defines the standby condition of the device, with the free layer having the lower perpendicular anisotropy. The second relationship defines the condition for voltage-induced switching, such that the voltage-controlled perpendicular anisotropy in the free layer be smaller than its demagnetizing field, thereby putting it in an unstable state for both switching voltages V1 and V2. The third relationship defines that the voltage-dependent (leakage-induced) shift of the hysteresis loops $H_{FLT}$ should be smaller/larger than the offset (internal device) field $H_{off}$, for voltages V1 and V2, respectively, in order to achieve bidirectional switching.

Again, the magnitude of the applied voltage of appropriate polarity determines the switching direction by modifying the field like torque. It will be noted the different requirements on the voltage-controlled magnetic anisotropy $K_{perp}$ in response to this different magnetization configuration when compared to previous sections.

In FIG. 15C a V1 pulse 140 is applied to the MeRAM in an initial state (reset condition) of parallel (P) of free layer 136 to change the magnetization of the FL layer 136 to anti-parallel (AP) as seen in the right side of that figure. In FIG. 15A, it is seen that the application of a larger pulse V2 138 does not change the initial state of magnetization of free layer 136, and the state is seen unchanged in the right side of that figure. Once set, as seen in FIG. 15D, the application of a V1 pulse 140 does not affect the cell state, as seen in the right of the figure. In FIG. 15B, from the set state, the application of a V2 pulse 138 (V2 >V1) changes the magnetization of the FL 136 back to parallel, resetting the device state.

In the above examples of FIG. 12, FIG. 13A through FIG. 13D, FIG. 14, and FIG. 15A through FIG. 15D, only one polarity of voltage brings about switching in the device, while the other polarity does not destabilize the FL magnetization. This polarity also corresponds to the direction in which the leakage current (FLT) acts in the opposite direction compared to the offset field.

This invention thus describes a MeRAM bit design where unipolar set/reset voltage pulses can switch the bit magnetization in opposite directions. Voltages of the opposite polarity do not affect the free layer state. The opposite polarity can thus be used for readout of the magnetic bit information using the TMR effect with low read disturbance.

Figure 17:
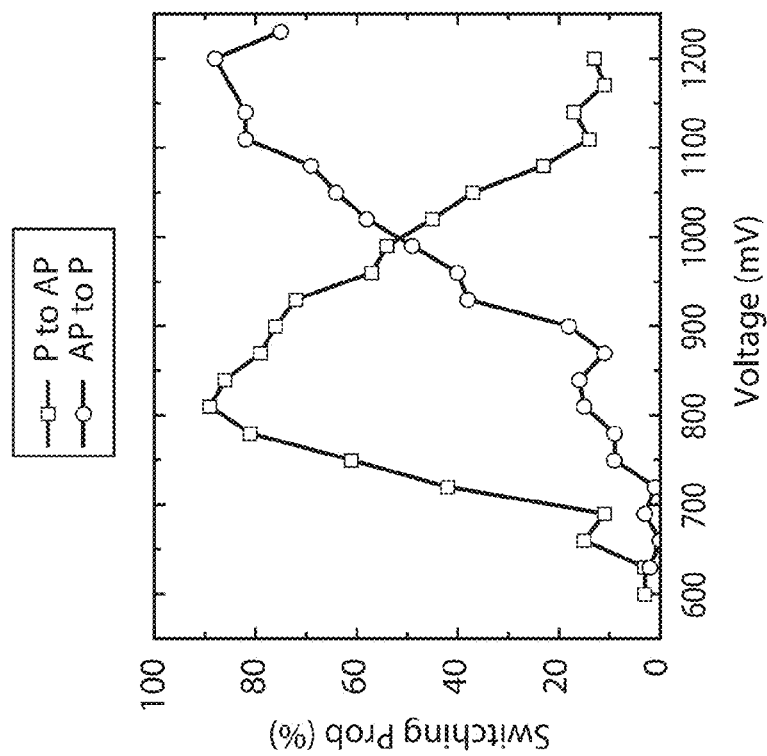
FIG. 17 is a graph of switching probability versus switching voltage for a MeRAM device utilizing voltage pulse amplitude (no magnetic field) for determining both switching directions, according to an embodiment of the present invention.
Figure 16:
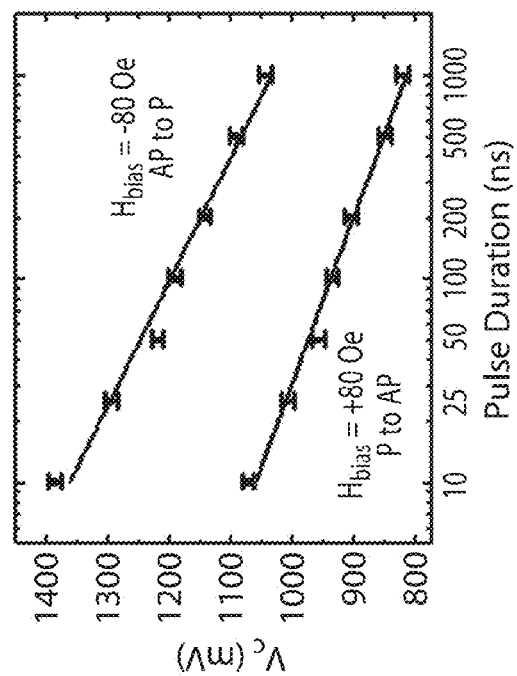
FIG. 16 is a graph of voltage-induced switching dynamics in response to a small magnetic field to determine switching direction according to an embodiment of the present invention.

FIG. 16 and FIG. 17 depict results confirming the operation of embodiments of the present invention. In FIG. 16 voltage-induced switching of a magnetic tunnel junction is seen, with the switching direction determined by a small external magnetic field, seen of −80 Oe in the upper curve for an AP to P switch, and of +80 Oe to facilitate the switch from P to AP. The switching times are seen down to 10 ns. In FIG. 17, bidirectional MeRAM bit switching is seen using FLT with voltage pulses that are 100 ms wide (it will be noted that characterization is often performed with short and long pulses). The measured switching probability curve is shown as a function of the applied voltage pulse amplitude, indicating a set/reset operation with unipolar switching voltages. The curve peaking on the left with the square points indicates P to AP switching, while the other curve with the round points, depicts AP to P switching.

4.0 Voltage-Controlled Switching of Domain Walls in a Nanomagnet.

Electric field control of magnetism can dramatically improve the energy efficiency of spintronic devices, enhancing the performance of magnetic memories. Perhaps more importantly, control of magnetism can expand the range of applications of nonvolatile spintronic devices beyond memory, by making them energetically competitive compared to conventional semiconductor switches, thereby enabling a new generation of ultralow-power nonvolatile spintronic systems. Spin-polarized currents have been widely used to manipulate and switch magnetization in nanomagnets. The use of currents, however, limits energy efficiency of spintronic memory and logic devices, including those based on domain walls.

The following inventive embodiments describe electric field control of micromagnetic configurations in nanomagnets, which exhibit voltage-controlled magnetic anisotropy (VCMA) at the interface of FM and DE films, exemplified as CoFeB and MgO films. It is seen that domain wall formation is voltage-dependent, and demonstrates VCMA-induced switching of the magnetization configuration between two domain-wall states with opposite chiralities, without the influence of spin-polarized currents.

The use of voltage to control magnetic properties enables a major paradigm shift in spintronics, eliminating the need for spin-polarized currents which are currently used to manipulate magnetization. Voltage control of magnetism has been explored through a number of approaches, including single-phase multiferroic materials, multiferroic heterostructures where magnetic and electrical properties are coupled through mechanical strain, semiconducting materials where carrier-mediated ferromagnetism is modulated by a gate voltage, as well as thin metallic films where ferromagnetic phase transition (i.e., Curie temperature) is modulated by an applied voltage.

It appears of significant value to consider electric field control of magnetic anisotropy at the FM/DE interface by a voltage applied across the DE layer, given that it uses widely adopted materials (e.g., materials used in magnetic tunnel junctions (MTJs) for magnetoresistive random access memory (MRAM)). These materials offer high tunneling magnetoresistance (TMR) ratios, and are compatible with the fabrication processes used for conventional semiconductor electronics. Furthermore, the fact that their magnetoelectric coupling is not strain-mediated allows them to offer high endurance, making them more suitable for logic and memory applications where frequent switching is required. Thus, the realization of VCMA-induced switching in magnetic nano-structures should not only lead to highly energy-efficient magnetic memories, but can also provide a critical enabler for ultralow-power spintronic logic devices, which generally require frequent and energy-efficient switching of magnetic states.

This mechanism applies to any voltage-controlled magnetic memory bit, such as those described in the previous embodiments, to reduce the voltage required for switching the memory bit in these structures, resulting in reduced operating voltage, improved energy efficiency, and increased memory speeds.

The reduction of the switching voltage is realized as follows. The ferromagnetic free layer (FL) has an in-plane (IP) and an out-of-plane (OOP) magnetic anisotropy. The OOP anisotropy is affected by the FM/DE interface properties, and can be controlled by electric fields (i.e., voltages) applied across the DE layer making use of the VCMA effect. Switching of the memory bit is performed using this effect, by applying a voltage across the DE layer, as outlined in previous embodiments. Voltage control over the magnetic configuration is maximized when the free layer is designed such that the IP and OOP anisotropies in the FM free layer are nearly equal. The FM fixed layer has a dominant in-plane or out-of-plane anisotropy. In this case, application of a voltage across the DE layer results in the largest effect on the magnetic configuration of the device, hence minimizing the switching voltage. Due to the competition between the IP and OOP magnetic configurations, however, a device designed in such a manner may not have a uniform in-plane or out-of-plane magnetization, instead forming a nonuniform domain-like or other micromagnetic state. While the formation of such a domain wall state may reduce the magnetoresistance ratio of the device, it provides a larger tunability in response to applied voltages, compared to the completely in-plane or out-of-plane cases. The micromagnetically nonuniform free layer can therefore be used to obtain a lower switching voltage.

The balance of the IP and OOP anisotropies can be achieved through the design of the free layer, including but not limited to tuning its composition, tuning its shape and thickness to adjust the OOP anisotropy (thinner films have a larger interfacial anisotropy), tuning its annealing temperature and annealing magnetic field, as well as using different capping or insertion layers to adjust the OOP anisotropy.

This invention covers in-plane as well as out-of-plane MeRAM switches and memory bits, such as but not limited to, those reported in previous memory embodiments, where the balance of IP and OOP anisotropies are utilized toward minimizing the necessary switching voltage, and/or where the micromagnetic configuration of the free layer may be nonuniform as a result.

Voltage-controlled formation, manipulation, and switching of domain walls using the VCMA effect in elliptical nanomagnets is described, which are preferably incorporated as free layers of CoFeB—MgO for readout via the TMR effect. The effect of CoFeB free layer thickness is investigated, as well as electric fields applied to the device, on the micromagnetic configurations of the nanoscale free layer. Micromagnetic simulations successfully reproduce the experimentally observed voltage-dependent magnetoresistance features, providing insight into the effect of electric fields on domain formation and magnetization configuration of the free layer. Voltage-controlled modulation of magnetization from in-plane to out-of-plane via an intermediate domain wall state is observed. Finally, VCMA-induced modification of coercivity in nanoscale patterned magnetic films is demonstrated allowing for voltage-induced switching of domain wall chirality. The direction of switching is controlled by a small in-plane external magnetic field, preferably of approximately 100 Oe or less, applied to the device.

FIG. 18 illustrates an embodiment 150 of a magneto-electric device utilized in this section. A pillar section 154 extends from a planar section 152. A voltage is shown being applied 156 between the top and bottom of the pillar. By way of example an Si/SiO$_2$ substrate 158 is seen over which is a bottom electrode 160. The pillar 154 comprises the following layers in order: Ta 162 (e.g., 5 nm); a free layer 164 of Co$_{20}$Fe$_{60}$B$_{20}$; a DE layer 166 of MgO; a FM fixed layer 168 of Co$_{60}$Fe$_{20}$B$_{20}$; a layer of Ru 170 (e.g., 0.85 nm) to provide antiferromagnetic inter-layer exchange coupling; an exchange-biased layer of Co$_{70}$Fe$_{30}$ (e.g., 2.3 nm) 172, the magnetization orientation of which is pinned by exchange bias using a layer of PtMn (e.g., 20 nm) 174; and a top electrode 176. By way of example and not limitation, the pillar of the devices utilized in this work were 170 nm (178)× 60 nm (180) elliptical nanopillars In free layer 164 the thickness defines in-plane, out-of-plane, or domain wall configurations of this layer, and was varied along a wedge on a single silicon wafer in testing, to demonstrate devices with each of these three magnetic configurations. In the DE layer of MgO 166, thickness defines the magnitude of the leakage current, and this was varied along a wedge on a single silicon wafer in testing, to demonstrate devices with different leakage currents.

The device structure is different from those of spin transfer torque (STT) devices with interfacial perpendicular anisotropy in two principle ways. First, the MgO tunneling barrier was designed to be thick enough to make current-induced STT small in these samples (maximum currents were approximately 10 µA in these tests). Secondly, for a number of devices the free layer thickness in this work is designed to be much closer to the compensation point of in-plane (IP) and out-of-plane (OOP) anisotropies, leading to a richer set of micromagnetic configurations, as described below.

Magnetization versus magnetic field (M-H) curves for Ta (5)/Co$_{20}$Fe$_{60}$B$_{20}$ (t$_{CoFeB}$=1.0-1.4 wedge)/MgO (thickness in nm) test samples indicate a thickness-dependent perpendicular anisotropy at the CoFeB—MgO interface (described in a later section of supplementary Information). The transition thickness for cancellation of perpendicular (interfacial) and shape-induced (in-plane) anisotropies for the samples was found to be approximately 1.1 nm. The overall perpendicular anisotropy K$_{eff}$ in the free layer is given by K$_{eff}$=K$_s$ (V)/t$_{CeFeB}$−2πM$_s^2$, where K$_s$ (V) is the (voltage-dependent) surface perpendicular anisotropy at the CoFeB—MgO interface, t$_{CoFeB}$ is the thickness of the free layer, and M$_s$ is the free layer saturation magnetization.

Figure 19A:
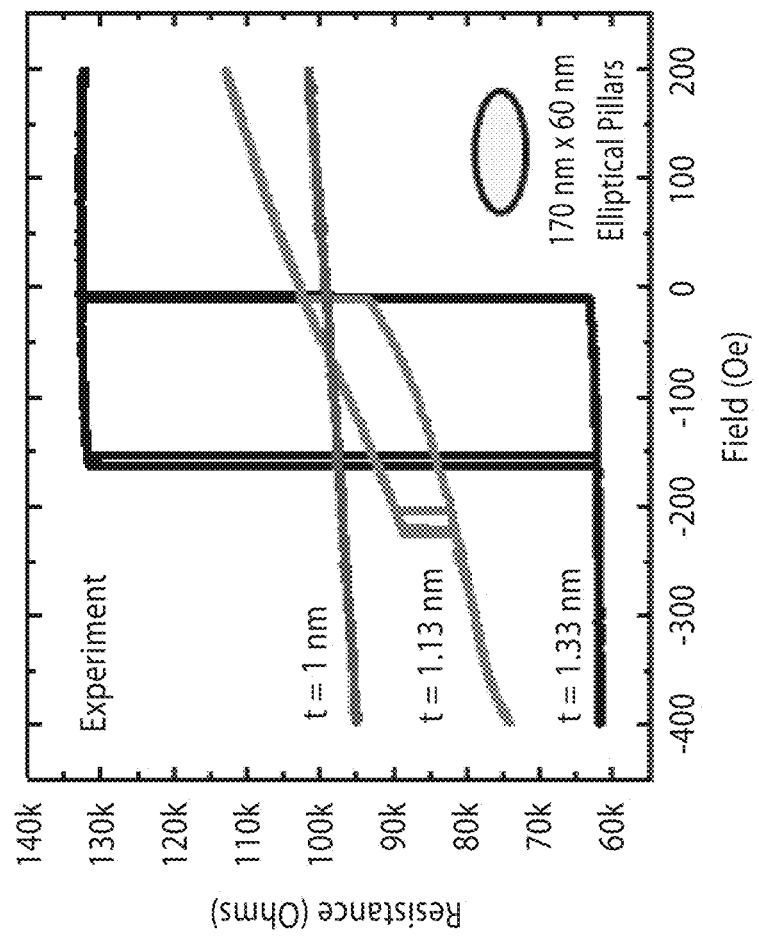
FIG. 19A through 19B are hysteresis graphs of electric resistance versus in-plane magnetic field (R-H) results according to an embodiment of the present invention.
Figure 19B:
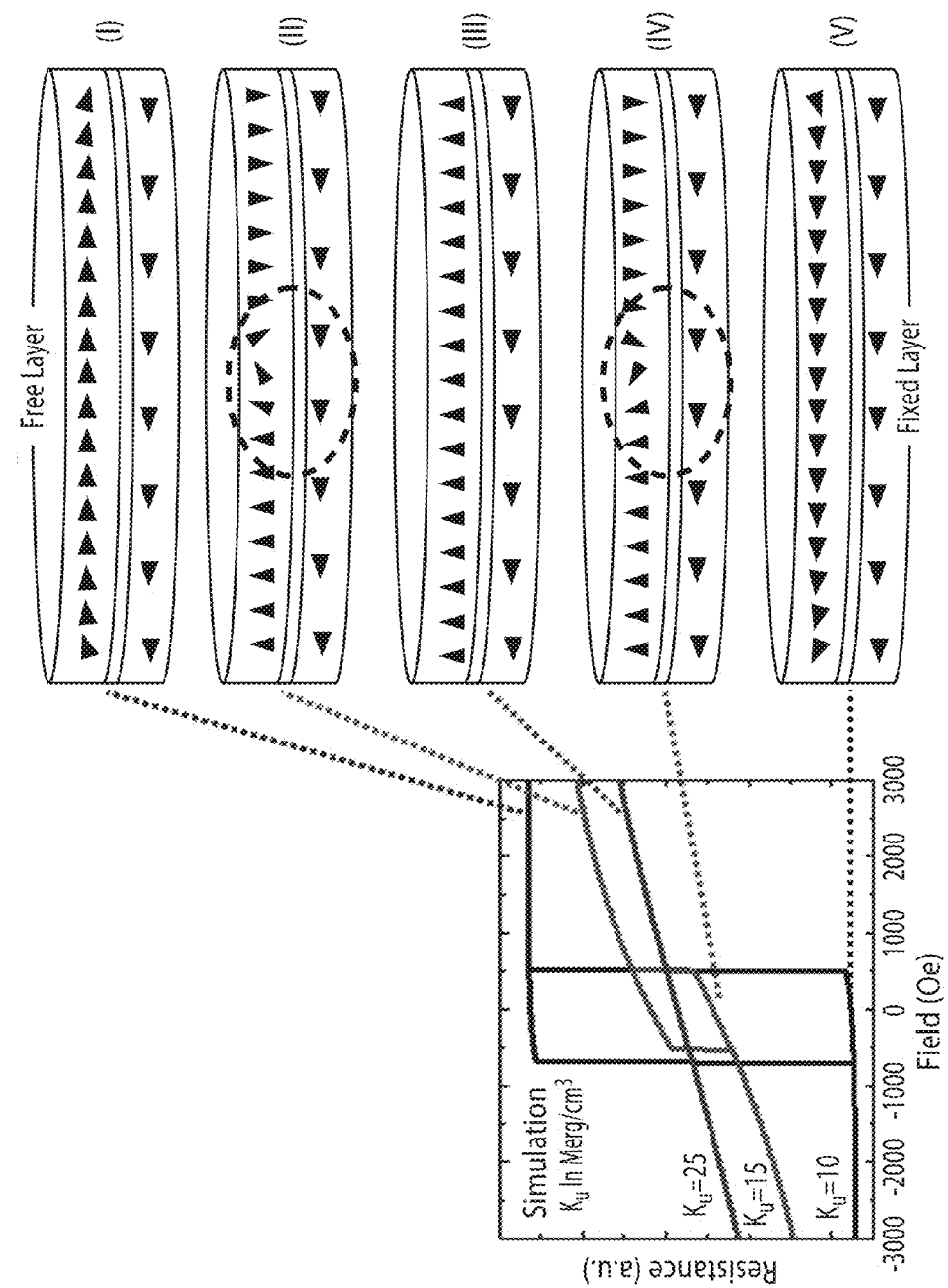

FIG. 19A and FIG. 19B depict measurements of the electric resistance versus in-plane magnetic field (R-H) loops, where the field is applied along the major axis of the elliptical nanomagnets. A dependence of the overall free layer anisotropy on thickness is evident from electrical measurements on patterned VCMA switch nanopillars with different Co$_{20}$Fe$_{60}$B$_{20}$ thickness values. The device with t$_{CoFeB}$=1.33 nm shows a square-shaped hysteresis behavior, the almost full frame hysteresis curve shown in FIG. 19A and FIG. 19B (marked t=1.33 nm), corresponding to an in-plane easy-axis defined by the ellipse's shape anisotropy. In contrast to this the t$_{CoFeB}$=1 nm device shows a hard-axis behavior with no hysteresis, as seen by the nearly horizontal line marked t=1 nm, indicating that the free layer easy axis is perpendicular to the sample plane. However, for the device with a free layer close to the transition thickness (t$_{CoFeB}$=1.13 nm marked as t=1.13 nm), the shape of the hysteresis loop is not consistent with a single-domain behavior, and instead can be attributed to a micromagnetic state with a domain wall in the free layer as seen in FIG. 19 B right panels II and IV. The formation of this domain structure is a consequence of the delicate energy balance in these finite-sized patterned VCMA switches, where the easy plane shape-induced anisotropy (i.e., demagnetization) and the easy axis perpendicular anisotropy nearly compensate for each other. The consequent lack of a clear energetic preference for either single-domain perpendicular or single-domain in-plane states allows for the formation of domain wall states in order to minimize the overall magnetostatic energy. The existence of domain walls in the free layer is supported by micromagnetic simulations, where a good qualitative agreement is found between the effects of reducing the CoFeB thickness and increasing the perpendicular anisotropy Ku as seen in FIG. 19B.

The perpendicular interfacial anisotropy Ku can also be modulated by voltages applied across the MgO layer. As a result, in a nanoscale VCMA switch structure, the applied voltage can also modify the micromagnetic configuration of the free layer, in a manner similar to the thickness dependence shown above. The voltage-tunability of the micromagnetic states in the free layer (i.e., their sensitivity to an applied electric field), is maximized close to the transition thickness.

Figure 20B:
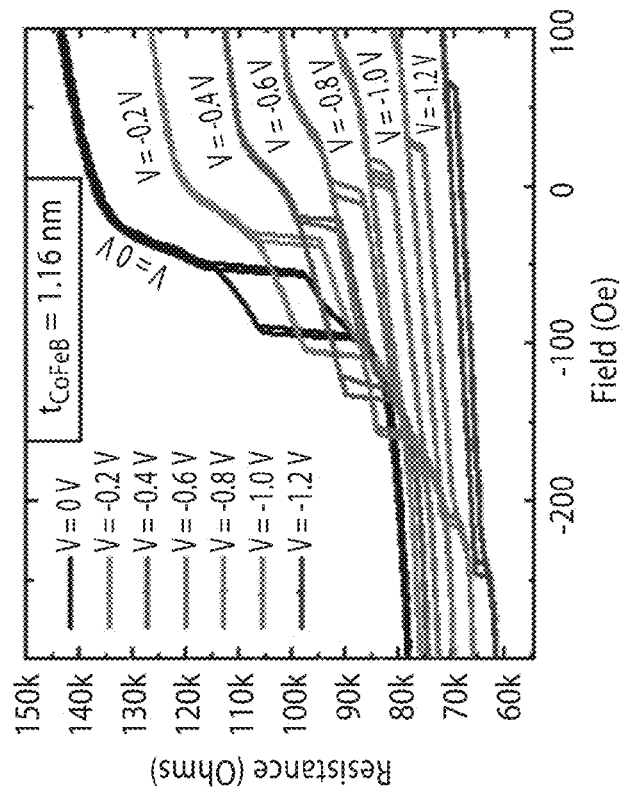
FIG. 20A through FIG. 20E are graphs of voltage-dependent electric resistance versus in-plane magnetic field (R-H) characteristics of a MeRAM device according to an embodiment of the present invention.
Figure 20A:
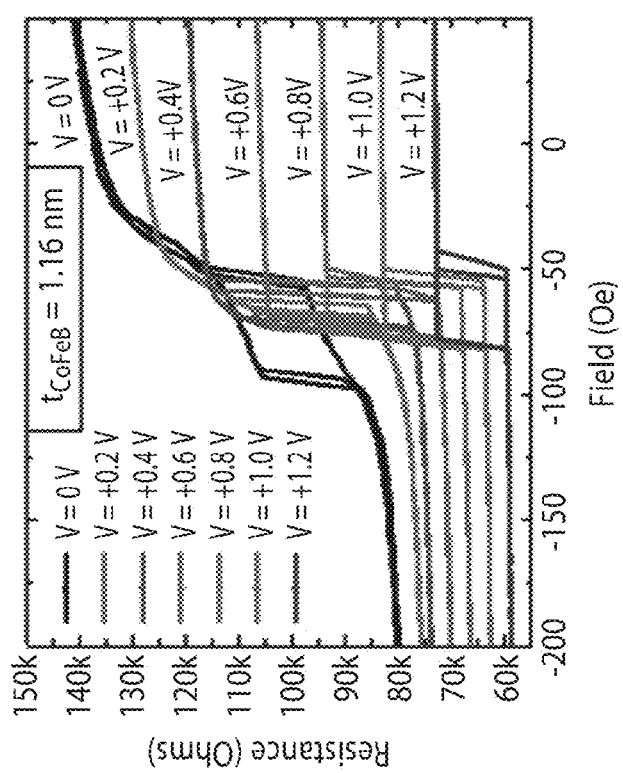
Figure 20D:
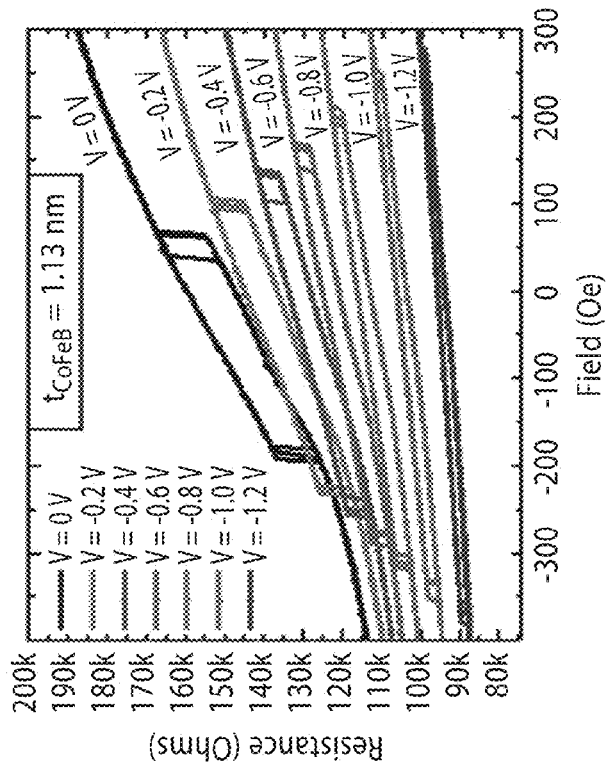
Figure 20C:
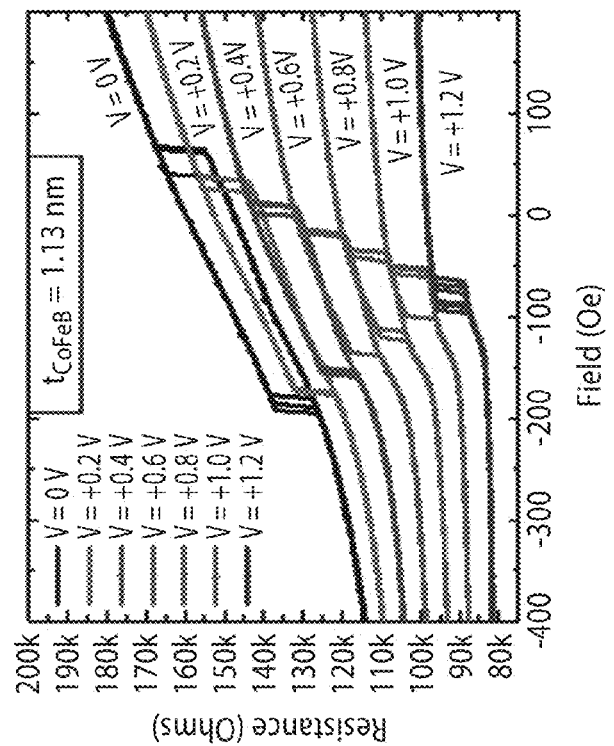
Figure 20E:
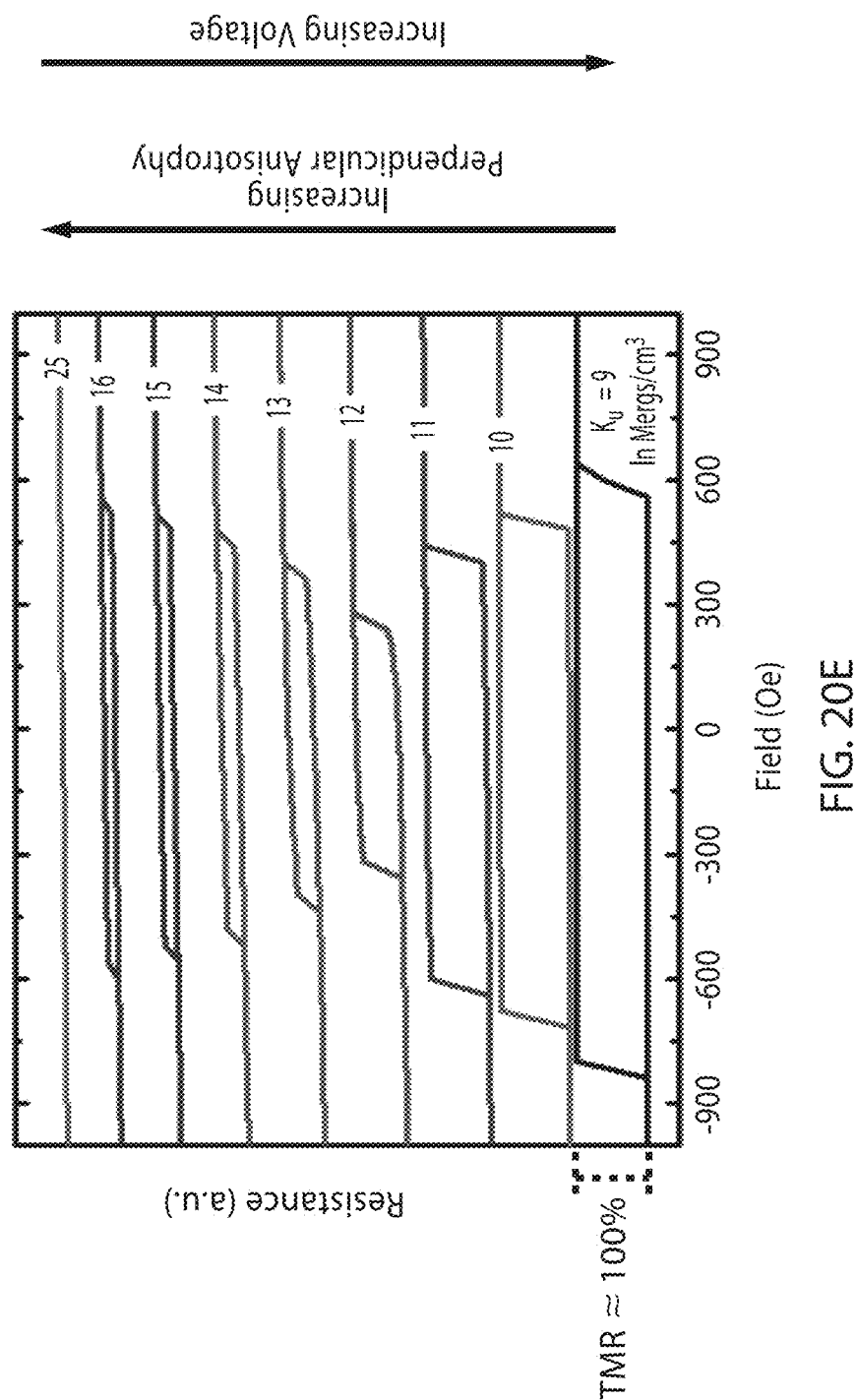

FIG. 20A through FIG. 20E illustrate resistance as a function of magnetic field characteristics according these tests. In FIG. 20A and FIG. 20B magnetoresistance loops are shown for different bias voltage levels in a device with the free layer thickness $t_{CoFeB}=1.16$ nm. All measurements are for fields applied in-plane and along the major axis of the elliptical device. In these tests, positive voltages reduce the perpendicular anisotropy Ku in the nanomagnets. At positive voltage biases (~1 V), an easy-axis loop corresponds to the magnetization of the free layer being in the sample plane. As the positive voltage is decreased, the increase of perpendicular anisotropy causes the coercivity to reduce until a domain wall state is formed, which is accompanied by the formation of a non-square-shaped hysteresis loop comparing FIG. 19B and FIG. 20A. When the voltage polarity is reversed, as seen in FIG. 20B, increasing the negative voltage further enhances the perpendicular anisotropy, resulting in a decrease of the domain wall width. At the same time, this translates into an increase in the coercivity of the micromagnetic state, and a reduction in the TMR ratio measured at the loop center. Eventually, a sufficiently large negative voltage forces the free layer magnetization entirely out of plane. The dependence of coercivity on applied voltage is greatly affected by the free layer thickness. By tuning the thickness of the free layer to a smaller value ($t_{CoFeB}=1.13$ nm), for example, the coercivity of the fully-in-plane state (for applied voltages ~1 V) is reduced, and one can obtain a monotonic (increasing) change of the coercivity with reducing voltage as seen in FIG. 20C and FIG. 20D. The dependence of coercivity on applied voltage (or equivalently, on perpendicular anisotropy) was found to be in good agreement with micromagnetic simulations. In FIG. 20E an example of simulated in-plane magnetoresistance loops are seen in which the change from easy axis to hard axis behavior and the associated changes in coercivity are in good qualitative agreement with the experimental results.

In the present invention the reduction of coercivity with positive voltages was exploited in order to electrically switch the domain wall chirality in the free layer (see FIG. 19B, right panel II and IV) without the influence of spin polarized currents.

Figure 21B:
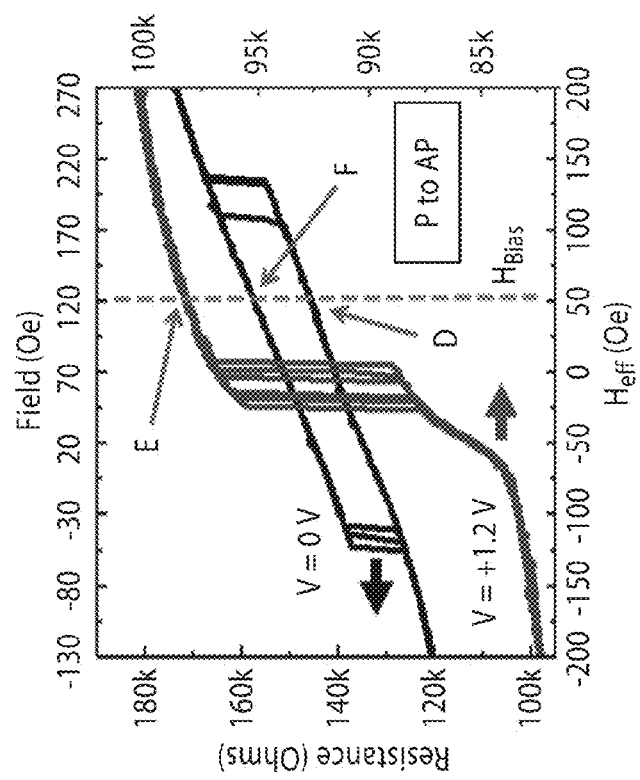
FIG. 21A through FIG. 21F are graphs of voltage induced switching of a MeRAM device according to an embodiment of the present invention.
Figure 21A:
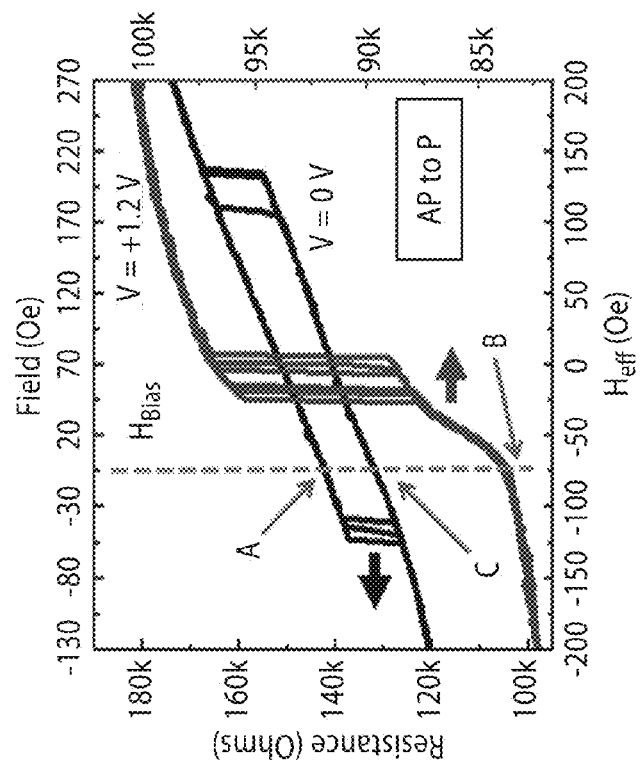
Figure 21D:
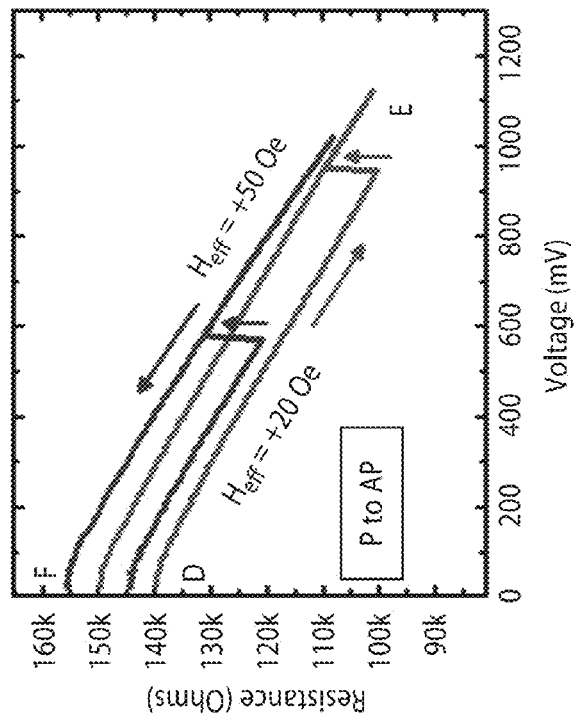
Figure 21C:
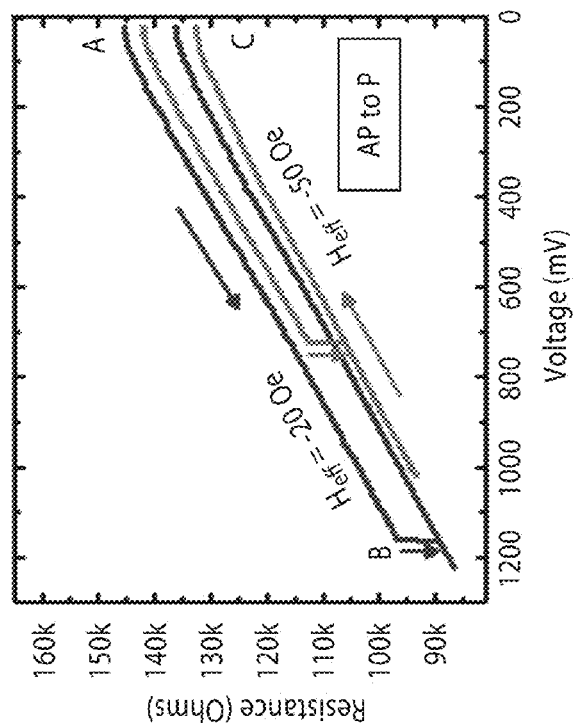

FIG. 21A through FIG. 21F depict voltage induced switching of domain wall chirality. To illustrate the switching process, consider the magnetic hysteresis curves at equilibrium (0 V) and at a positive voltage, as shown in FIG. 21A and FIG. 21B. The equilibrium state has a coercivity of about 120 Oe, and the TMR ratio between its high- and low-resistance domain wall states is approximately 9%. The loops show an offset field $H_{off}$ of about 70 Oe due to non-zero coupling to the pinned layer. The top horizontal axis denotes the easy axis bias field $H_{bias}$ applied to the device, while the bottom horizontal axis shows the effective field $H_{eff}=H_{bias}-H_{off}$. When a positive voltage pulse is applied to a device in the high-resistance state (point A in FIG. 21A and FIG. 21C), the perpendicular anisotropy of the free layer decreases, reducing its coercivity. As a result, under the new energy landscape, the magnetization is forced to relax to the low-resistance intermediate state (point B in FIG. 21A and FIG. 21C). After the voltage is removed, the magnetization reconfigures into the domain wall state with opposite chirality (point C in FIG. 21A and FIG. 21C), completing the reversal process. FIGS. 21A and 21B show that the sign of the effective field acting on the free layer, (i.e. $H_{eff}$) will determine the direction of switching, and hence the voltage-induced switching is unidirectional for a given bias magnetic field. FIG. 21C and FIG. 21D depict the quasi-static switching for both directions in the device, using 100 ms long voltage pulses. The switching process was reproduced in micromagnetic simulations, illustrating that the voltage-induced modification of the micromagnetic texture is responsible for bringing about the chirality reversal.

The switching shown in FIG. 21A through 21F corresponds to the reversal of the domain wall chirality near the center of the nanomagnet (see FIG. 19B, right panel II and IV). This is consistent with the relatively small effective MR ratio ($(\Delta R/R)_{eff}$ of approximately 9%) between the two domain-wall states observed in this device, since the areas near the edges of the free layer (which are perpendicularly magnetized) do not contribute to the MR. For comparison, the corresponding TMR ratio for single-domain in-plane devices (with a thicker free layer) on the same wafer is $(\Delta R/R)_{max}$ of about 110% (as seen in FIG. 19A). This also partly explains the reduction of $(\Delta R/R)_{eff}$ with increasing perpendicular anisotropy (see FIG. 20B and FIG. 20D), as the increase of the latter reduces the domain wall width in the free layer, by making the surface-induced perpendicular anisotropy more dominant in determining the magnetostatic configuration.

Figure 21F:
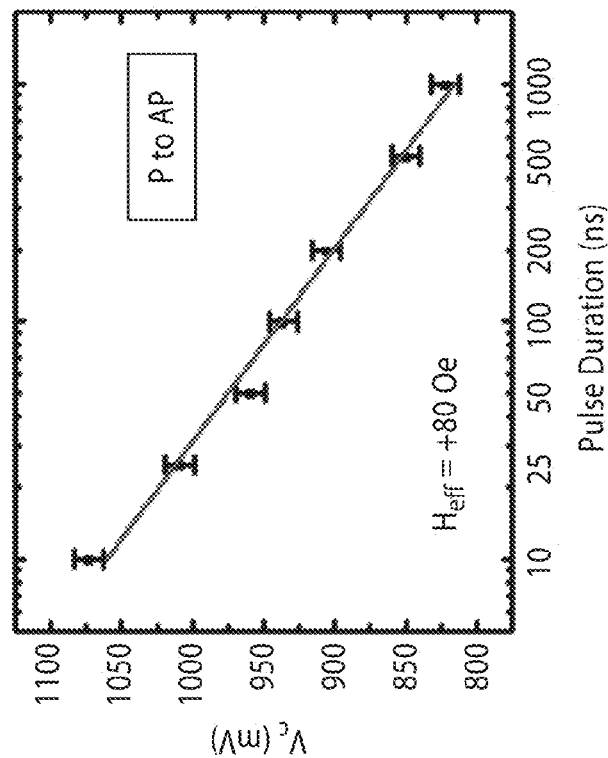
Figure 21E:
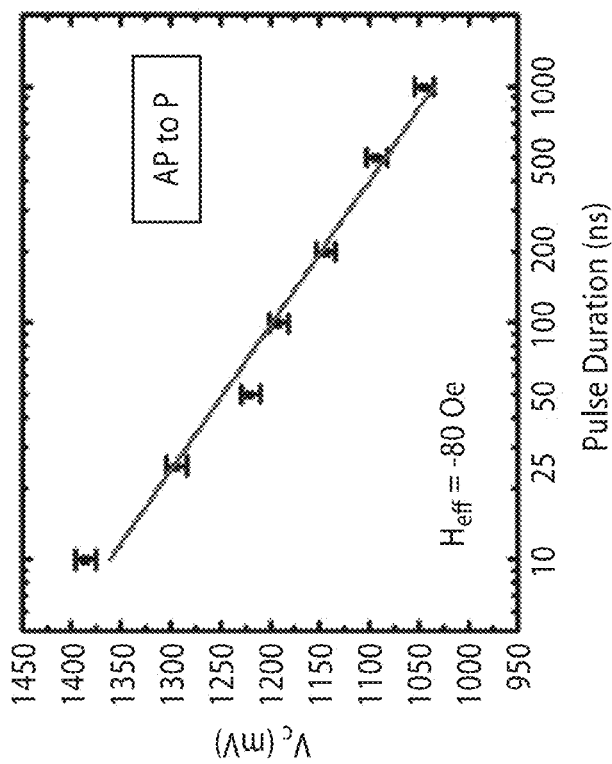

FIG. 21E and FIG. 21F depict the dependence of mean switching voltage $V_c$ on the applied voltage pulse width t, measured down to 10 ns, obtained from >100 switching events for each data point. The results demonstrate voltage-induced switching of the domain wall chirality with voltage pulses down to 10 ns and amplitudes of approximately 1 V for both low (i.e., parallel (P)) to high (i.e., anti-parallel (AP)), and AP to P switching directions. The dependence of switching voltage on pulse width follows a thermal activation model which can be well fitted to a function of the form $V_c = V_{c0} = (1-\Delta^{-1} \ln(t/\tau_0))$, where $\tau_0$ is the so-called attempt time corresponding to the inverse of the resonance frequency of the magnetization, and $V_{c0}$ is the extrapolated critical voltage for switching at $t=\tau_0$.

Switching in both directions was performed using voltages of the same polarity, with a small bias magnetic field to determine the switching direction, as discussed above. The dependence of the switching voltage on the applied magnetic field, was also measured.

Figure 22B:
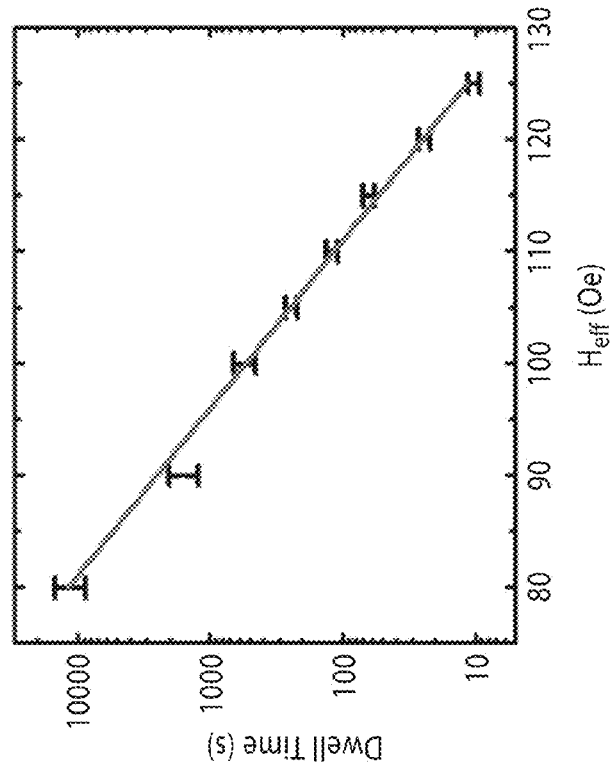
FIG. 22A and FIG. 22B are graphs of switching voltage and dwell time, respectively, for a MeRAM device according to an embodiment of the present invention.
Figure 22A:
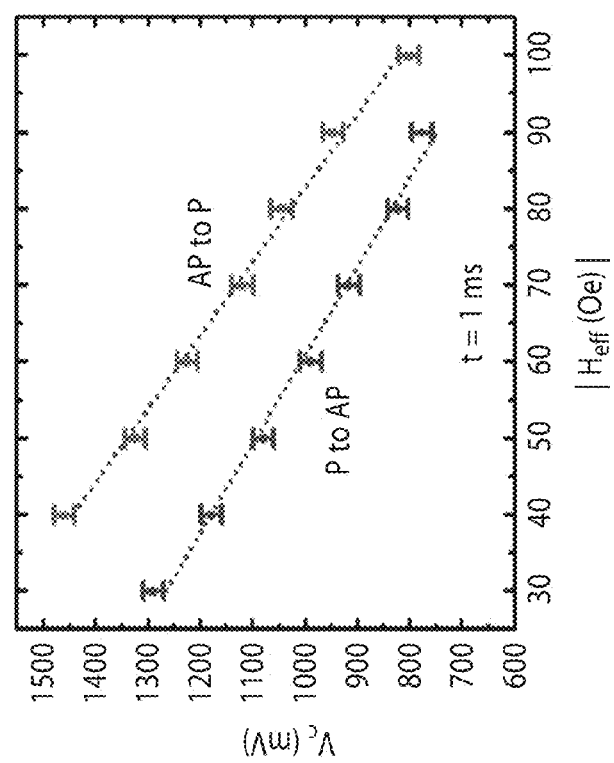

FIG. 22A and FIG. 22B represent switching voltage and dwell time, respectively for the test device. FIG. 22A depicts a decrease of the switching voltage with increasing $H_{eff}$, indicating a trade-off between the switching voltage amplitude and the in-plane magnetic field which assists the switching process.

The thermal stability of the domain wall state in these test devices was characterized. This was performed by measuring the mean dwell time for thermally-induced switching (obtained from >30 switching cycles at zero applied voltage), for different magnetic fields applied to the device, as shown in FIG. 22B. Extrapolation of the curve to the standby ($N_{eff}=0$ Oe) condition yields a retention time of about $1.7 \times 10^9$ seconds (>50 years), which corresponds to an energy barrier for thermally induced switching of Eb=~42 kT for an attempt time of $\tau_0$=1 ns, where k and T are the Boltzmann constant and temperature, respectively. The equilibrium domain wall state thus provides sufficient stability for nonvolatile operation.

In conclusion, electric-field manipulation of domain wall dynamics has been demonstrated, and in particular, electric-field-induced switching of domain wall chirality in nanomagnets, using the voltage-controlled magnetic anisotropy (VCMA) at the interface of MgO and CoFeB films. The switching does not utilize spin-polarized currents. The micromagnetic configuration was read out using the TMR effect. It is expected that a similar voltage control over domain wall dynamics is possible in other nanostructures (e.g., nanowires, and so forth) as well. These results provide a method to reduce the switching voltage and energy dissipation of MeRAM, by exploiting the larger sensitivity to applied voltages in free layers with a nonuniform micromagnetic configuration.

4.1 Methods of Sample Preparation.

The following describes, by way of example and not limitation, the preparation used for the sample described in Section 4.0. Continuous multilayer films with a composition of substrate/bottom electrode as seen in FIG. 18 were deposited in a physical vapor deposition (PVD) system, and subsequently annealed at 300° C. for 2.0 hours in an in-plane magnetic field of 1 T. The films were then patterned into 170 nm×60 nm elliptical nanopillars for electrical transport measurements, using electron-beam lithography and ion milling techniques. All metallic films were deposited by DC sputtering, while the tunnel barrier was deposited by radio-frequency (RF) sputtering from a ceramic MgO target. The CoFeB free layer and MgO tunnel barrier thickness were varied across the same wafer during deposition to form two perpendicular wedges. The MgO tunneling barrier was designed to be thick enough to make current-induced spin transfer torque (STT) negligible in these samples. To measure the magnetic properties of the $Co_{20}Fe_{60}B_{20}$ free layer at the film-level, test structures consisting of substrate/bottom electrode/Ta (5)/$Co_{20}Fe_{60}B_{20}$ ($t_{CoFeB}$=1.0-1.4 wedge)/MgO/top electrode (thickness in nm) were also deposited.

Electrical measurements were at room temperature by contacting the nanopillars via top and bottom electrodes through a high-bandwidth (40 GHz) probe. The magnetic fields were always applied in-plane, along the easy (long) axis of the nanopillars. The electrical measurements were performed in a probe station with a closed-loop PID magnet-gaussmeter system, resulting in a typical error of <1% for the set value of the magnetic field, fluctuations below 1-2 Oe and no overshoot during the onset of the field. For measuring the dwell time, a small voltage (10 mV) was used to monitor the state of the nanomagnet. For each magnetic field, at least 30 events were recorded in order to estimate the dwell time. For the pulsed experiments, a bias T was used to decouple the voltage pulse (RF-arm) from the static measurement of the device resistance (DC-arm). The mean switching voltage at a given magnetic field and voltage pulse duration was measured from at least 100 switching events.

Fixed layers in the multilayer stack were included in the micromagnetic simulations to account for the non-zero coupling fields observed in these tests. Most of the simulations were run without considering temperature fluctuations (T=0 K). However, simulations including temperature (T=300 K) effects were used to confirm the presence and stability of the domain-wall state at room temperature. In all simulations, the effect of voltage was emulated by changes in the perpendicular anisotropy.

4.2 Supplemental Information.

4.2.1 Magnetic Properties of the CoFeB Films.

To measure the magnetic properties of the $Co_{20}Fe_{60}B_{20}$ free layer at the film-level, test structures consisting of substrate/bottom electrode/Ta (5)/$Co_{20}Fe_{60}B_{20}$ ($t_{CoFeB}$=1.0-1.4 wedge)/MgO/top electrode (thickness in nm) were deposited.

Figure 23B:
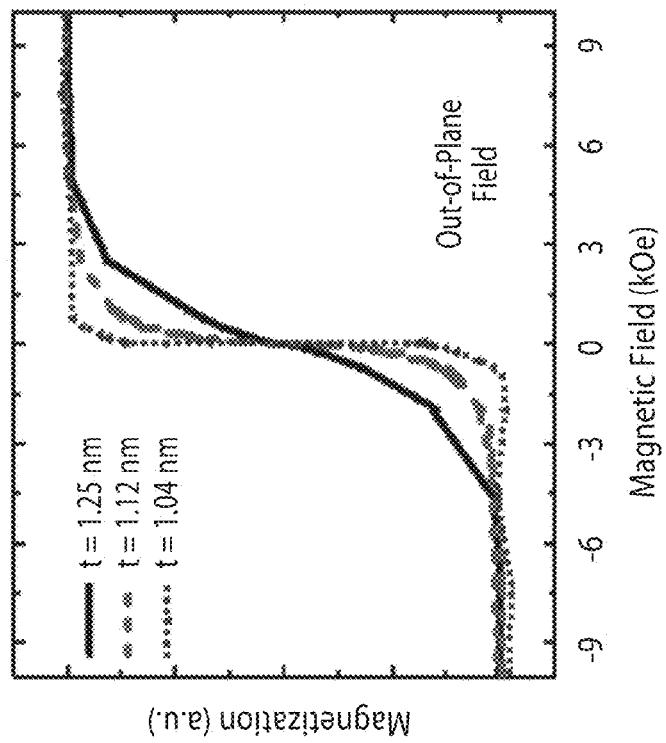
FIGS. 23A and 23B are graphs of magnetization versus magnetic field (M-H) curves for in-plane and out-of-plane fields, respectively, for a MeRAM device according to an embodiment of the present invention.
Figure 23A:
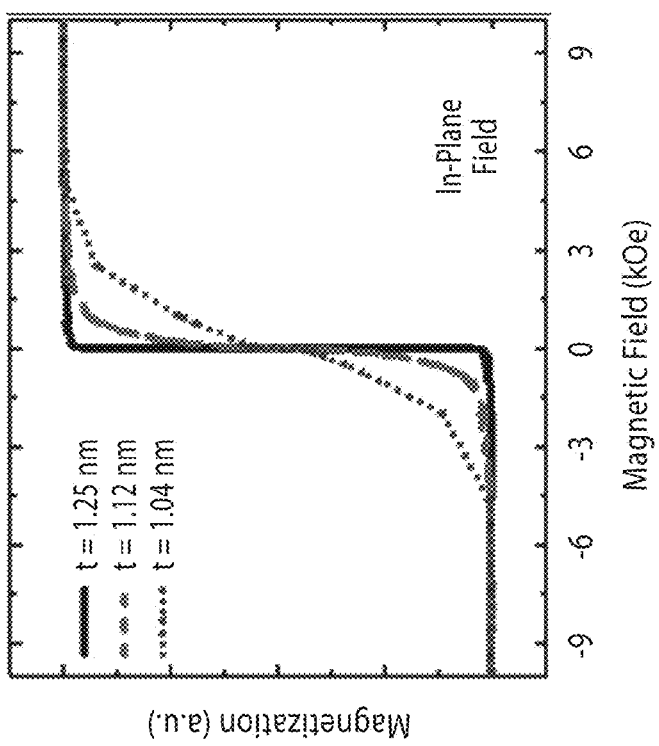

FIG. 23A and FIG. 23B depict magnetization versus magnetic field (M-H) curves for in-plane and out-of-plane fields, respectively, for these test samples with three different values of CoFeB thickness ($t_{CoFeB}$). It was observed that the magnetic easy axis of the structure changes from in-plane for $t_{CoFeB}$=1.25 nm, to out-of plane for $t_{CoFeB}$=1.04 nm, due to the perpendicular anisotropy at the CoFeB—MgO interface. Different curves correspond to different values of the $Co_{20}Fe_{60}B_{20}$ thickness. It was also found that the transition thickness for cancellation of interfacial perpendicular anisotropy and shape-induced demagnetizing fields for these samples is approximately 1.1 nm, as also noticed in FIG. 19A and FIG. 19B. This is smaller than the transition thickness observed for MgO/$Co_{20}Fe_{60}B_{20}$/Ta stacks (where CoFeB is capped by, rather than deposited on Ta) with a similar free layer composition, which can be attributed to the presence of a magnetically dead layer in the latter case.

4.2.2 Micromagnetic States in the Free Layer with Perpendicular Anisotropy.

The effective perpendicular anisotropy $K_{eff}$ in the free layer is given by $K_{eff}=K_s(V)/t_{CoFeB}-2\pi M_s^2$, where $K_s(V)$ is the surface perpendicular anisotropy at the CoFeB—MgO interface (which can be modulated by the voltage applied to the VCMA switch), $t_{CoFeB}$ is the thickness of the free layer, and $2\pi M_s^2$ is the shape-induced demagnetization energy which favors the magnetization to be in the sample plane. As can be observed from FIG. 19A, FIG. 19B, and FIG. 20A through FIG. 20E, voltage and thickness have qualitatively similar effects on $K_{eff}$, and therefore, on the micromagnetic state of the free layer, which can be seen from the magnetoresistance curves.

In particular, thickness values are of interest where the perpendicular anisotropy is close to cancelling the in-plane shape anisotropy. For this case, such as when $K_{eff} \rightarrow 0$, changes in $K_s(V)$ will generate a larger relative change in $K_{eff}$, thereby maximizing the voltage tunability of the micromagnetic states in the free layer. In this regime, when the in-plane shape-induced and interfacial perpendicular anisotropy nearly cancel each other, the magnetization configuration becomes more sensitive to other effects such as dipole fields. When a domain wall state is formed in the free layer (see FIG. 19B, right panel II and IV), the magnetic stray fields are reduced. The resulting reduction of the dipolar magnetostatic energy can translate into a larger energy reduction than the increase in the exchange energy due to the nonuniform magnetization configuration, making the domain structure an energetically favorable state.

4.2.3 Switching Dynamics of the Domain Wall Chirality.

The voltage dependence of the perpendicular anisotropy has been exploited in this work to enable voltage-induced switching as discussed in the previous section. The micromagnetic picture of the switching process was reproduced in simulations and is described in this section. The simulated structures were elliptical pillars that included the synthetic anti-ferromagnetic fixed layer. Effects of thermal excitations due to finite temperature were not considered in these simulations of the equilibrium magnetoresistance curves (shown in FIG. 20E). Thus while the simulations reproduced all qualitative features of the observed data, no further attempts were made to obtain a quantitative agreement.

Figure 24:
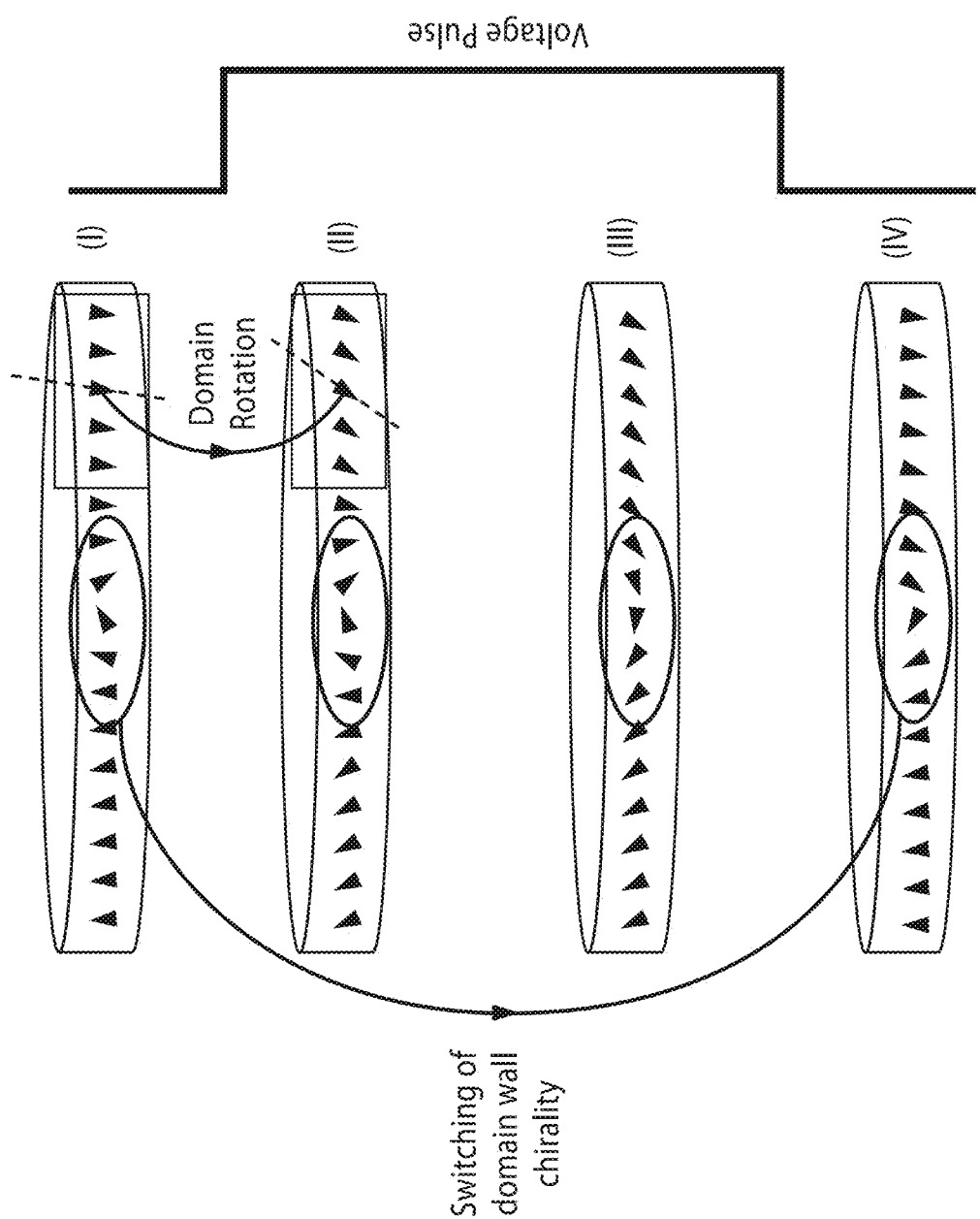
FIG. 24 is a schematic of simulated free layer magnetization dynamics for an embodiment of the present invention, showing magnetization cross sections along the major axis of the nanopillar for different times during the switching process.

FIG. 24 illustrates the simulated free layer magnetization dynamics, as cross sections along the major axis of the nanopillar for different times, (I), (II), (III) and (IV), during the switching process. The initial (equilibrium) state (I) for the magnetization corresponds to a domain wall. Given that the fixed layer is single-domain and magnetized in the plane of the sample, the magnetoresistance mostly originates from the center portion of the free layer (highlighted in FIG. 19B and FIG. 24), which has a non-zero in-plane component. It is the switching of the magnetic moments within this domain wall (i.e., reversal of the domain wall chirality) that brings about the observed difference in the low- and high-resistance states of our devices. When a positive voltage pulse is applied (II), the perpendicular anisotropy is reduced and the magnetization in the two domains rotates to acquire a larger in-plane component (highlighted domain rotation in FIG. 24. However, this state, which is best described as a >180° domain wall, is thermally unstable, and the magnetization relaxes by switching the domain wall to the intermediate state (III). Finally, when the voltage pulse is released, the perpendicular anisotropy is increased again, and the system ends up in a domain wall state with the domain wall magnetization switched to the opposite direction (IV), resulting in a different resistance value.

FIG. 25 illustrates an embodiment 190 of a magneto-electric device which is an alternative to that described in FIG. 18, and shown with a free layer (FL), fixed layer and a semi-fixed layer of ferroelectric material (FM). A pillar section 194 extends from a planar section 192. A voltage is shown being applied 196 between the top and bottom of the pillar. By way of example an Si/SiO$_2$ substrate 198 is seen over which is a bottom electrode 200. In this example dipole-coupling is also depicted between the fixed and semi-fixed layers utilizing an ordinary metal (e.g., Ta). However, the fixed and semi-fixed layer may be alternatively exchange-coupled through a thin metallic barrier film (e.g., Ruthenium (Ru)). The pillar 194 comprises the following layers in order, Ta 202 (e.g., ~1-10 nm), an FM free layer 204 of $Co_{20}Fe_{60}B_{20}$ (e.g., ~1-2 nm), a barrier layer of MgO 206 (e.g., ~1-2 nm), an FM fixed layer 208 of $Co_{20}Fe_{60}B_{20}$ (e.g., ~1-2 nm), another layer of Ta 210 (e.g., ~1-2 nm), a semi-fixed layer 212 of $Co_{20}Fe_{60}B_{20}$, another layer of MgO 214 (e.g., ~1-2 nm), and a top electrode 216. The combination of 204, 206 and 208 resembles a magnetic tunnel junction (MTJ), and exhibits tunneling magnetoresistance (TMR) which allows for reading of the magnetic state of the FL by measuring the resistance across the stack. As in the previous embodiments, each of the free, semi-fixed and fixed layers may itself consist of several sub-layers, which, acting together, provide the free or fixed layer functionality.

From the discussion above it will be appreciated that the invention can be embodied in various ways, including the following:

1. A voltage-controlled magnetic anisotropy (VCMA) switch apparatus, comprising: at least two ferromagnetic (FM) layers having a FM fixed layer and a FM free layer; a dielectric (DE) layer interposed between said FM fixed layer and said FM free layer; and wherein material, shape and thickness of said FM free layer and said FM fixed layer are selected to have in-plane (IP) and out-of-plane (OOP) anisotropies; wherein material, shape and thickness of said FM free layer is selected to have in-plane (IP) and out-of-plane (OOP) anisotropies which are nearly equal; and wherein OOP anisotropy of said FM free layer is affected by interface properties between said FM layers and said DE layer, and is controlled by voltages applied across said DE layer as an applied voltage, giving rise to a voltage-controlled magnetic anisotropy (VCMA) effect which switches magnetization orientation of said FM free layer in said apparatus.

2. The apparatus of embodiment 1, wherein said magnetization of said FM free layer is switchable between two magnetization orientation states that are either in-plane (IP) or out-of-plane (OOP).

3. The apparatus of embodiment 1, wherein said magnetization orientation states are parallel (P) and anti-parallel (AP) with respect to magnetization orientation of said FM fixed layer.

4. The apparatus of embodiment 1, wherein said apparatus changes magnetic states (switches) in response to voltage application, and does not require a flow of electric charge currents through said apparatus or through a conductor disposed proximal said apparatus to perform said switching.

5. The apparatus of embodiment 1, wherein said switching of magnetization orientation of said ferromagnetic (FM) free layer is determined in response to the applied voltage which induces magnetization rotation and allows full switching to occur in response to the presence of a stray magnetic field to switch the magnetization to its final switched state.

6. The apparatus of embodiment 5, wherein said at least one stray field arises from said ferromagnetic (FM) fixed layer.

7. The apparatus of embodiment 5, wherein said at least one stray field arises from said ferromagnetic (FM) fixed layer and from an additional ferromagnetic (FM) semi-fixed layer.

8. The apparatus of embodiment 1, wherein said ferromagnetic (FM) free layer comprises one layer or a combination of layers.

9. The apparatus of embodiment 1, wherein said ferromagnetic (FM) fixed layer comprises one layer or a combination of layers.

10. The apparatus of embodiment 1, wherein said magnetization orientation is changed in response to the width of said voltage pulse on an apparatus configured for precessional motion of the magnetization.

11. The apparatus of embodiment 10, wherein said magnetization orientation is changed in response to the width of said voltage pulse being approximately ½ of the precessional period, or an odd multiple thereof.

12. The apparatus of embodiment 1, wherein said apparatus comprises an in-plane (IP) voltage-controlled magnetic anisotropy (VCMA) switch apparatus.

13. The apparatus of embodiment 1, wherein said apparatus comprises an out-of-plane (OOP) voltage-controlled magnetic anisotropy (VCMA) switch apparatus.

14. The apparatus of embodiment 1, wherein magnetization orientation of said apparatus can be read by measuring electrical resistance through the FM free layer, DE layer, and FM fixed layer in response to tunneling magnetoresistance (TMR) properties.

15. The apparatus of embodiment 1, wherein said ferromagnetic material is selected from the group of ferromagnetic materials consisting of Fe, Co, Pt, Pd, CoFe, and CoFeB.

16. The apparatus of embodiment 1, wherein said dielectric material comprises MgO.

17. The apparatus of embodiment 1, wherein said OOP anisotropy is tuned by controlling FM composition including a ratio of Fe content, FM layer shape, and FM layer thickness.

18. The apparatus of embodiment 1, wherein said OOP anisotropy is tuned by placing an additional non-magnetic metal layer adjacent to an FM layer, where said metal layer increases said OOP anisotropy and said VCMA effect.

19. The apparatus of embodiment 18, where said metal layer comprises Tantalum (Ta).

20. The apparatus of embodiment 1, further comprising at least one ferromagnetic (FM) semi-fixed layer disposed proximal said ferromagnetic (FM) fixed layer, and a spacer layer separating said FM semi-fixed layer from said FM fixed layer.

21. The apparatus of embodiment 20, wherein said spacer layer comprises a metallic material that does not contribute to the voltage-controlled magnetic anisotropy of the apparatus.

22. The apparatus of embodiment 20, wherein said magnetization orientation is changed bidirectionally for different applied voltages.

23. The apparatus of embodiment 20, wherein said voltage-controlled magnetic anisotropy (VCMA) switch is incorporated as a bit within a magneto-electric random access memory (MeRAM) in which bit state is written to a first state in response to application of a first voltage signal, and written to a second state in response to application of a second voltage signal.

24. The apparatus of embodiment 23, wherein said MeRAM is read in response to electrical resistance detected across said apparatus in response to application of a voltage having a reverse polarity of said first and second voltage.

25. The apparatus of embodiment 20, wherein said FM semi-fixed layer and said FM fixed layer comprise an exchange-coupled pair of layers, and said spacer layer comprises an antiferromagnetic inter-layer exchange coupling material to enhance exchange coupling.

26. The apparatus of embodiment 25, wherein said spacer layer of antiferromagnetic inter-layer exchange coupling material comprises Ruthenium (Ru), where thickness of said Ru layer is selected to provide antiferromagnetic inter-layer exchange coupling.

27. A voltage-controlled magneto-electric random access memory (MeRAM) apparatus, comprising: at least three ferromagnetic (FM) layers having a FM fixed layer, a FM semi-fixed layer, and a FM free layer; wherein said FM semi-fixed layer and said FM free layer are disposed on opposite sides of said FM fixed layer; and a dielectric (DE) layer interposed between said FM free layer and FM fixed layer; a spacer layer separating said FM semi-fixed layer from said FM fixed layer; wherein material, shape and thickness of said FM free layer, said FM fixed layer, and said FM semi-fixed layer are selected to have in-plane (IP) and out-of-plane (OOP) anisotropies; wherein material, shape and thickness of said FM free layer is selected to have in-plane (IP) and out-of-plane (OOP) anisotropies which are nearly equal; wherein material, shape and thickness of said FM semi-fixed layer is selected to have in-plane (IP) and out-of-plane (OOP) anisotropies which are balanced between being nearly equal, and a preference plane of the FM fixed layer; wherein OOP anisotropy of said FM free layer is affected by the interface properties between the FM layers and said DE layer, and is controlled by voltages applied across said DE layer as an applied voltage, giving rise to a voltage-controlled magnetic anisotropy (VCMA) effect which rotates magnetization orientation of said FM free layer and is fully switched in response to a stray magnetic field from said FM semi-fixed and fixed layers, with state of the magnetic orientation determining bit state for said MeRAM; and wherein OOP anisotropy of said FM semi-fixed layer is affected by the interface properties between the FM layers and said DE layer, and is controlled by voltages applied across said DE layer as an applied voltage, giving rise to a voltage-controlled magnetic anisotropy (VCMA) effect which rotates magnetization orientation of said FM semi-fixed layer without fully switching its magnetic orientation.

28. The apparatus of embodiment 27, further comprising a second DE layer disposed proximal said FM semi-fixed layer, and where interface properties between the FM semi-fixed layer and said second DE layer affect said OOP anisotropy of said FM semi-fixed layer and is controlled by voltages applied across said second DE layer, as an applied voltage, giving rise to a voltage-controlled magnetic anisotropy (VCMA) effect which rotates magnetization orientation of said FM semi-fixed layer without fully switching its magnetic orientation.

29. The apparatus of embodiment 27, wherein bit state is written to a first state in response to application of a first voltage signal, and written to a second state in response to application of a second voltage signal.

30. The apparatus of embodiment 28, wherein said MeRAM is read in response to electrical resistance detected across said apparatus in response to application of a voltage having a reverse polarity of said first and second voltage.

31. A voltage-controlled magnetic anisotropy (VCMA) switch apparatus, comprising: at least two ferromagnetic (FM) layers having a FM fixed layer, and a FM free layer; a dielectric (DE) layer interposed between said FM free layer and FM fixed layer; and wherein material, shape and thickness of said FM free layer and said FM fixed layer are selected to have in-plane (IP) and out-of-plane (OOP) anisotropies; wherein material, shape and thickness of said FM free layer is selected to have in-plane (IP) and out-of-plane (OOP) anisotropies which are nearly equal; wherein said OOP anisotropy of said FM free layer is affected by interface properties between the FM layers and said DE layer, and is controlled by voltages applied across said DE layer as an applied voltage, giving rise to a voltage-controlled magnetic anisotropy (VCMA) effect which switches magnetization orientation of said FM free layer in said apparatus; and wherein said magnetization of said FM free layer is switched between two magnetization states comprising a magnetic domain wall, wherein said domain wall contains a large in-plane (IP) magnetization component.

32. The apparatus of embodiment 31, wherein said magnetization orientation states are domain walls with opposite chiralities, wherein magnetization of said domain wall chiralities is parallel (P) and anti-parallel (AP) with respect to magnetization orientation state of said FM fixed layer.

33. A voltage-controlled magnetic anisotropy (VCMA) switch apparatus, comprising: at least two ferromagnetic (FM) layers having a FM fixed layer, and a FM free layer; and a dielectric (DE) layer interposed between said FM free layer and FM fixed layer; wherein material, shape and thickness of said FM free layer and said FM fixed layer are selected to have in-plane (IP) and out-of-plane (OOP) anisotropies; wherein material, shape and thickness of said FM free layer is selected to have in-plane (IP) and out-of-plane (OOP) anisotropies which are nearly equal; wherein said OOP anisotropy of said FM free layer is affected by interface properties between the FM layers and said DE layer, and is controlled by voltages applied across said DE layer as an applied voltage, giving rise to a voltage-controlled magnetic anisotropy (VCMA) effect which switches magnetization orientation of said FM free layer in said apparatus; and wherein thickness of said DE layer is selected to allow sufficient leakage current for determining a direction of switching based on a leakage-current induced magnetic torque in response to an applied voltage, while said leakage-current is insufficient for switching the magnetization state of said apparatus.

34. The apparatus of embodiment 33, wherein said voltage-controlled magnetic anisotropy (VCMA) switch is incorporated as a bit within a magneto-electric random access memory (MeRAM) in which bit state is written to a first state in response to application of a first voltage signal, and written to a second state in response to application of a second voltage signal.

35. The apparatus of embodiment 33, wherein said magnetization of said FM free layer is switched between two magnetization orientation states that are either in-plane (IP) or out-of-plane (OOP).

36. The apparatus of embodiment 33, wherein said magnetization orientation states are parallel (P) and anti-parallel (AP) with respect to magnetization orientation of said FM fixed layer.

37. The apparatus of embodiment 33, wherein said VCMA switch changes magnetic states, switches, in response to voltage application, and does not require a flow of electric charge currents through said apparatus or through a conductor disposed proximal said apparatus to perform said switching.

38. The apparatus of embodiment 33, wherein said switching of magnetization orientation of said ferromagnetic (FM) free layer is determined in response to applied voltage which induces magnetization rotation and allows full switching to occur in response to a stray magnetic field to switch the magnetization to its final switched state.

39. The apparatus of embodiment 38, wherein said at least one stray field arises from said ferromagnetic (FM) fixed layer and from an additional ferromagnetic (FM) semi-fixed layer.

40. The apparatus of embodiment 33, wherein magnetization orientation of said voltage-controlled magnetic anisotropy (VCMA) switch can be read by measuring electrical resistance across layers through said FM free layer and said FM fixed layer in response to tunneling magnetoresistance (TMR) properties.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A voltage-controlled magneto-electric random access memory (MeRAM) apparatus, comprising:
   at least three ferromagnetic (FM) layers having a FM fixed layer, a FM semi-fixed layer, and a FM free layer;
   wherein said FM semi-fixed layer and said FM free layer are disposed on opposite sides of said FM fixed layer; and
   a dielectric (DE) layer interposed between said FM free layer and FM fixed layer;
   a spacer layer separating said FM semi-fixed layer from said FM fixed layer;
   wherein material, shape and thickness of said FM free layer, said FM fixed layer, and said FM semi-fixed layer are selected to have in-plane (IP) and out-of-plane (OOP) anisotropies;
   wherein material, shape and thickness of said FM free layer is selected to have in-plane (IP) and out-of-plane (OOP) anisotropies which are nearly equal;
   wherein material, shape and thickness of said FM semi-fixed layer is selected to have in-plane (IP) and out-of-plane (OOP) anisotropies which are balanced between being nearly equal, and a preference plane of the FM fixed layer;
   wherein OOP anisotropy of said FM free layer is affected by the interface properties between the FM layers and said DE layer, and is controlled by voltages applied across said DE layer as an applied voltage, giving rise to a voltage-controlled magnetic anisotropy (VCMA) effect which rotates magnetization orientation of said FM free layer and is fully switched in response to a stray magnetic field from said FM semi-fixed and fixed layers, with state of the magnetic orientation determining bit state for said MeRAM; and
   wherein OOP anisotropy of said FM semi-fixed layer is affected by the interface properties between the FM layers and said DE layer, and is controlled by voltages applied across said DE layer as an applied voltage, giving rise to a voltage-controlled magnetic anisotropy (VCMA) effect which rotates magnetization orientation of said FM semi-fixed layer without fully switching its magnetic orientation.

2. The apparatus recited in claim 1, further comprising a second DE layer disposed proximal said FM semi-fixed layer, and where interface properties between the FM semi-fixed layer and said second DE layer affect said OOP anisotropy of said FM semi-fixed layer and is controlled by voltages applied across said second DE layer, as an applied voltage, giving rise to a voltage-controlled magnetic anisotropy (VCMA) effect which rotates magnetization orientation of said FM semi-fixed layer without fully switching its magnetic orientation.

3. The apparatus recited in claim 1, wherein bit state is written to a first state in response to application of a first voltage signal, and written to a second state in response to application of a second voltage signal.

4. The apparatus recited in claim 2, wherein said MeRAM is read in response to electrical resistance detected across said apparatus in response to application of a voltage having a reverse polarity of said first and second voltage.

* * * * *